(12) United States Patent
Hebert

(10) Patent No.: US 8,637,360 B2
(45) Date of Patent: Jan. 28, 2014

(54) POWER DEVICES WITH INTEGRATED PROTECTION DEVICES: STRUCTURES AND METHODS

(75) Inventor: Francois Hebert, San Mateo, CA (US)

(73) Assignee: Intersil Americas Inc., Milpitas, CA (US)

( * ) Notice: Subject to any disclaimer, the term of this patent is extended or adjusted under 35 U.S.C. 154(b) by 312 days.

(21) Appl. No.: 12/950,202

(22) Filed: Nov. 19, 2010

(65) Prior Publication Data

US 2011/0260174 A1    Oct. 27, 2011

Related U.S. Application Data

(60) Provisional application No. 61/327,291, filed on Apr. 23, 2010, provisional application No. 61/327,334, filed on Apr. 23, 2010.

(51) Int. Cl.
*H01L 21/338* (2006.01)

(52) U.S. Cl.
USPC .............. 438/167; 438/105; 438/931; 257/77

(58) Field of Classification Search
USPC ........................................................ 438/167
See application file for complete search history.

(56) References Cited

U.S. PATENT DOCUMENTS

| | | | |
|---|---|---|---|
| 2001/0038112 A1* | 11/2001 | Gambino et al. | 257/301 |
| 2002/0060904 A1 | 5/2002 | Higuchi | |
| 2003/0030056 A1* | 2/2003 | Callaway, Jr. | 257/76 |
| 2005/0121688 A1 | 6/2005 | Nagai et al. | |
| 2005/0133818 A1 | 6/2005 | Johnson et al. | |
| 2007/0032029 A1* | 2/2007 | Chow et al. | 438/330 |

OTHER PUBLICATIONS

U.S. Patent and Trademark Office, "Notice of Allowance", "U.S. Appl. No. 12/950,453", Apr. 3, 2013, pp. 1-13.
U.S. Patent and Trademark Office, "Office Action", "U.S. Appl. No. 12/950,453", Dec. 11, 2012, pp. 1-13.

* cited by examiner

*Primary Examiner* — Ajay K Arora
(74) *Attorney, Agent, or Firm* — Fogg & Powers LLC

(57) ABSTRACT

Exemplary embodiments provide structures and methods for power devices with integrated clamp structures. The integration of clamp structures can protect the power device, e.g., from electrical overstress (EOS). In one embodiment, active devices can be formed over a substrate, while a clamp structure can be integrated outside the active regions of the power device, for example, under the active regions and/or inside the substrate. Integrating clamp structure outside active regions of power devices can maximize the active area for a given die size and improve robustness of the clamped device since the current will spread in the substrate by this integration.

10 Claims, 43 Drawing Sheets

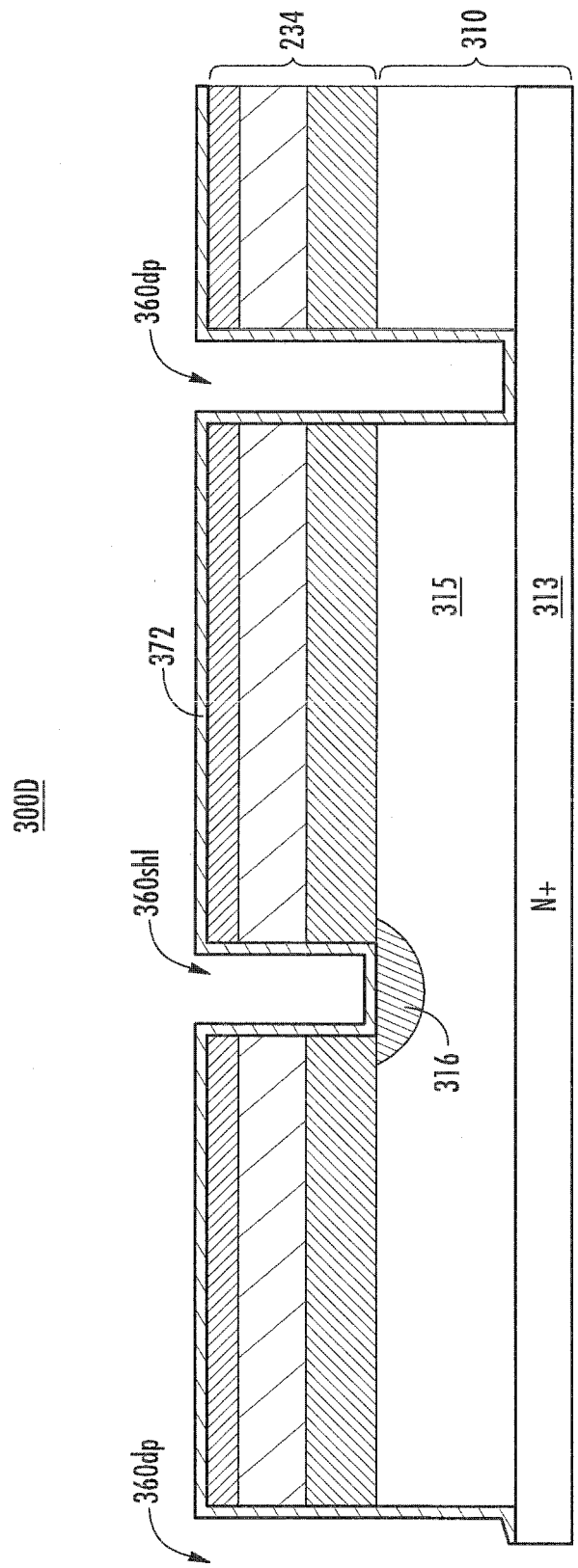

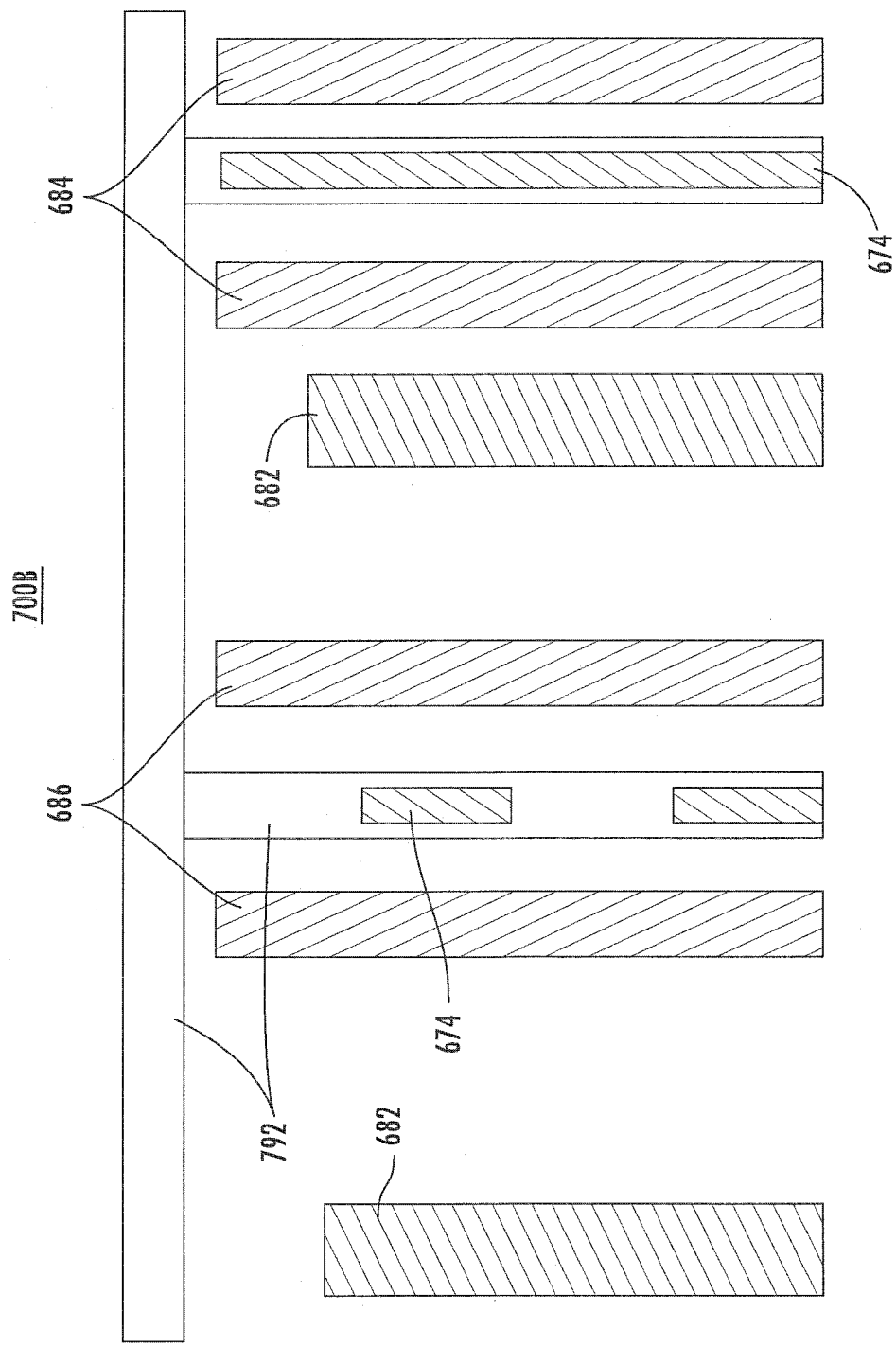

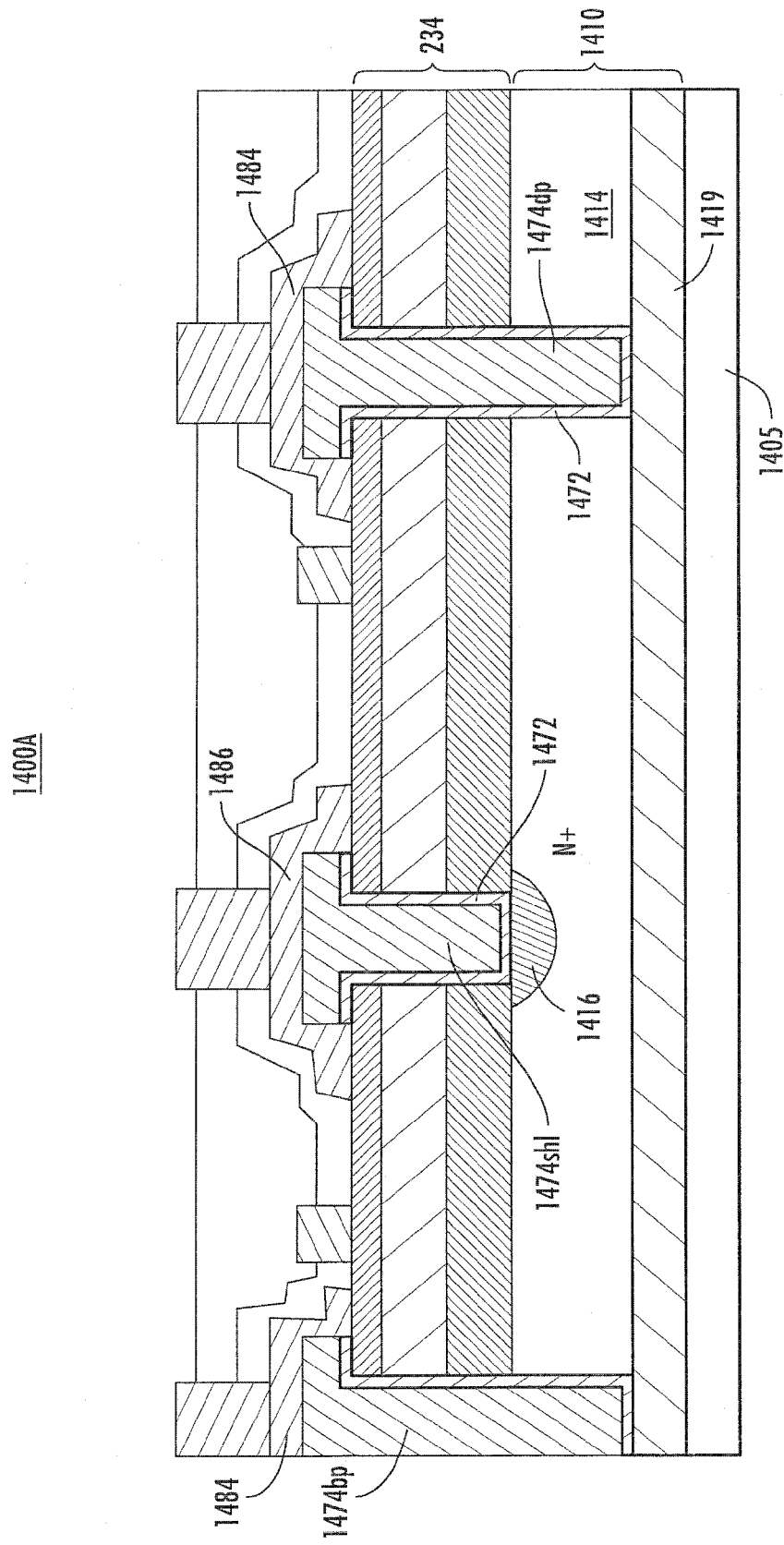

POWER DEVICES WITH INTEGRATED PROTECTION DEVICES: STRUCTURES AND METHODS

RELATED APPLICATIONS

This application claims priority from U.S. Provisional Patent Applications Ser. Nos. 61/327,291 and 61/327,334, both filed Apr. 23, 2010, which are hereby incorporated by reference in their entirety.

DESCRIPTION OF THE EMBODIMENTS

Reference will be made below in detail to exemplary embodiments of the present teachings, examples of which are illustrated in the accompanying drawings. Wherever possible, the same reference numbers will be used throughout the drawings to refer to the same or like parts. The accompanying drawings, which are incorporated in and constitute a part of this specification, illustrate embodiments of the present teachings and together with the description, serve to explain the principles of the present teachings. In the figures:

FIGS. 3A-3E depict an exemplary power device integrated with a P+N⁻N+ diode at various stages of fabrication in accordance with various embodiments of the present teachings;

FIGS. 7A-7B depict another exemplary power device integrated with a PN diode in accordance with various embodiments of the present teachings;

FIG. 11A depicts an exemplary power device integrated with a P+NN+ diode in accordance with various embodiments of the present teachings;

FIGS. 14A-14B depict exemplary power devices having a SOD substrate integrated with an N+PP+ diode and having different trench electrode depths in accordance with various embodiments of the present teachings;

Figure 1A:
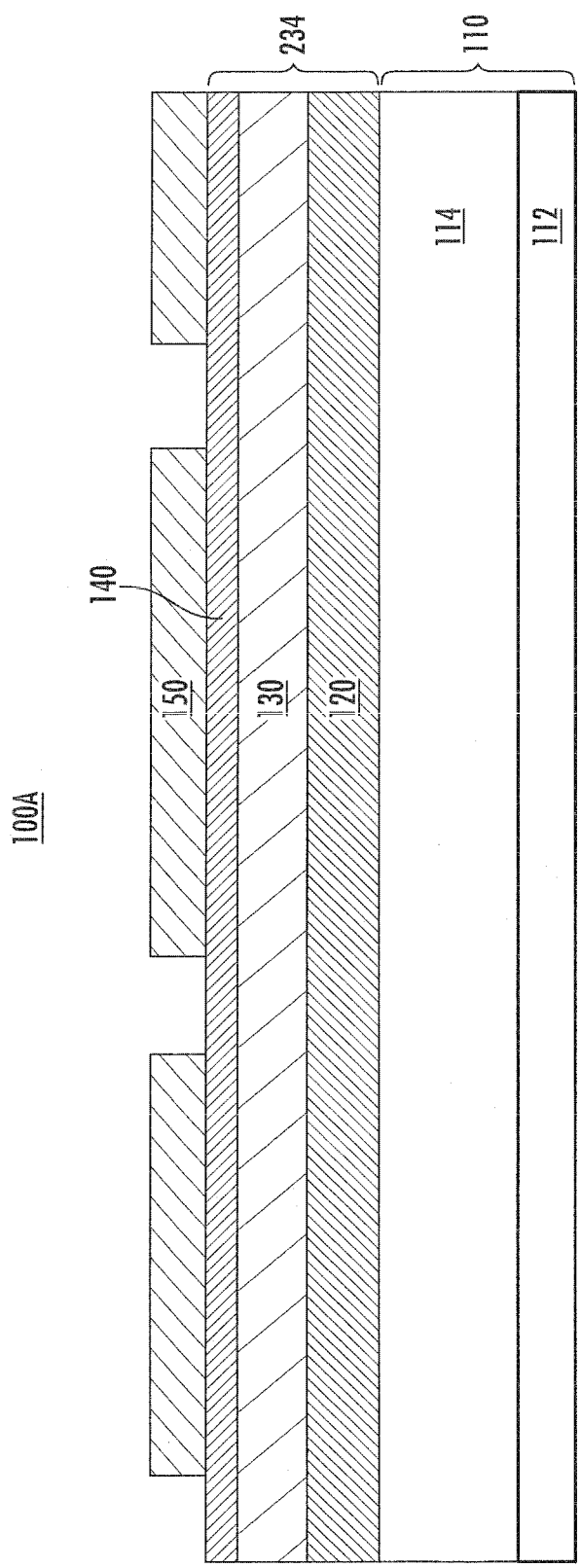
FIGS. 1A-1G depict an exemplary power device integrated with an N+PP+ diode at various stages of fabrication in accordance with various embodiments of the present teachings.

It should be noted that some details of the FIGS. have been simplified and are drawn to facilitate understanding of the inventive embodiments rather than to maintain strict structural accuracy, detail, and scale.

Exemplary embodiments provide structures and methods for power devices with integrated clamp structures. The integration of clamp structures can protect the power device, e.g., from electrical overstress (EOS). In one embodiment, active devices can be formed over a substrate, while a clamp structure can be integrated outside the active regions of the power device, for example, under the active regions and/or inside the substrate.

In embodiments, the active devices can be a lateral active device including, e.g., a field effect transistor (FET), etc. An exemplary FET can include a high electron mobility transistor (HEMT) power device. The clamp structure can be formed in isolation regions between active cells of an exemplary HEMT power device and/or under the active cells inside a silicon substrate. This integration is different from conventional integration of protection structures, which are integrated in active regions of the power device and thus take up HEMT active area. Therefore, integrating clamp structure outside active regions (for example, under the active area) of power devices can maximize the active area for a given die size and improve robustness of the clamped device since the current will spread in the substrate by this integration. The substrate can then be used for power electrode connection, which simplifies packaging of the power device.

In embodiments, the term "clamp structure" refers to any structure that can be integrated to protect power devices without taking up active area of the power devices. As disclosed herein, the clamp structure can include, but is not limited to, diodes of PN, P+N, PN+, P+N+, N+NPP, P+PN+, N+PP+, P+NN+, etc; Schottky diodes with or without self-aligned guard rings; Zener and/or Avalanche diodes; transient clamps (TVS); diode/bipolar transistor pairs; bipolar devices including NPN, PNP, etc.; striped clamps; and/or other clamp structures.

FIGS. 1-16 depict various embodiments of the present teachings. One of ordinary skill in the art will understand that the description of the embodiments below is exemplary, that variations to the processes and resulting structures of the various embodiments, for example to the materials, material conductivities, thicknesses, and widths, dopants, doping concentrations, geometries, etc., will be apparent.

As used herein, the disclosed clamped power device can be formed by various crystal growth techniques including, but not limited to, metal-organic chemical vapor deposition (MOCVD) (also known as organometallic vapor phase epitaxy (OMVPE)), pulsed MOCVD, molecular-beam epitaxy (MBE), gas source MBE (GSMBE), metal-organic MBE (MOMBE), atomic layer epitaxy (ALE), and/or hydride vapor phase epitaxy (HVPE). In embodiments, the growth of an epitaxial layer can be substantially the same in all directions, i.e., both laterally and vertically.

While the following exemplary embodiments discuss specific semiconductor layers, it will be understood that any known compound semiconductor (e.g., III-V, II-VI, etc.) can be used, including binary compound semiconductors, e.g., GaN, AlN, InN, GaAs, InP, InAs, etc., ternary compound semiconductors, e.g., AlGaN, InAlN, AlGaAs, InGaN, InAlAs, InGaAs, etc., and quaternary compound semiconductors, e.g., AlInGaN, AlGaInP, etc. It will also be understood that to manufacture the presently taught clamped power devices, these compound semiconductors can be layered and/or stacked in various combinations.

Various dopants can be used for layers or regions of the clamped power devices to provide desired conductivities. The dopant can be, for example, a P-type dopant such as boron, Mg, Zn, Cd, Hg, and C; or an N-type dopant such as As, Sb, phosphorus, Si, Ge, Sn, S, Se and Te.

In embodiments, the clamped power device can include a substrate formed of a material including, but not limited to, sapphire, silicon carbide (SiC), silicon (Si), Sapphire on Silicon (SOS), silicon-on-diamond (SOD), silicon-on-diamond-on-silicon (SODOS), diamond, silicon-on-insulator (SOI), III-V semiconductor compounds such as GaN or GaAs, metal, ceramic, or glass.

In one embodiment, the substrate can be a layer of P+ or N+ doped silicon. In another embodiment, the substrate can include a layered structure having a P-doped epitaxial (i.e., P-epi) layer (or an N-epi layer) of, e.g., silicon, disposed on a P+ layer (or an N+ layer). In an additional embodiment, the substrate can be a silicon-on-diamond (SOD) substrate having a silicon epi-layer disposed on a P+ doped or an un-doped diamond layer. In other embodiments, the substrate can include silicon-on-diamond-on-silicon (SODOS) having a silicon handle wafer attached to the diamond layer of the SOD substrate.

In embodiments to form clamp structures in the substrate, various doping or implant processes can be performed to form an N+ region or a P+ region in the epi-layer of the substrate, wherein the N+ region can be a cathode N+ diffusion region, and the P+ region can be an anode P+ diffusion region for the integrated diodes.

As used herein, unless otherwise specified, the N+ region can be formed by doping or implanting a portion of the substrate epi-layer with an N-type dopant, for example, with As, Sb or Phos using an implant dose ranging from about 1E14 atoms/cm$^2$ to about 2E16 atoms/cm$^2$ at an energy ranging from about less than 10 keV to about 180 KeV. This can be followed by an anneal process, for example, at a temperature ranging from about 850° C. to about 1200° C. It should be noted that multiple implants can be used to tailor the resulting doping profile using, e.g., As plus Phos, or different energy of As or Phos or Sb, etc.

As used herein, unless otherwise specified, the P+ region can be formed by doping or implanting a portion of the substrate epi-layer with a P-type dopant, for example, that can be boron-doped (using B11 or BF$_2$ for example) using an implant dose ranging from about 1E14 atoms/cm$^2$ to about 2E16 atoms/cm$^2$ at an energy ranging from about 10 keV to about 180 KeV.

Conductive materials and structures can be used for forming the exemplary clamped power devices. For example, conductive materials and structures can be used for trench electrodes and/or trench electrode barrier layer for connecting the clamp structure with the active device; gate/source/drain electrodes of the active device, Schottky electrodes, etc.

The conductive materials and structures can include metals of indium (In), titanium (Ti), tungsen (W), silicon (Si), aluminum (Al), platinum (Pt), nickel (Ni), cobalt (Co) or gold (Au), for example, in a number of multi-layered or alloy combinations such as Al/Ti/Pt/Au, Ni/Au, Ti/Al, Ti/Au, Ti/Al/Ti/Au, Ti/Al/Au, Ti/TiN CoSix/TiN, TiW, TiWN, WSix using techniques known to one of ordinary skill in the art.

For example, trench electrodes can be formed through the active region of the power device and on a layer of the substrate. The trench electrodes can include electrodes having a single depth and/or electrodes with different depths to connect the active device with the integrated clamp structure. In embodiments, the trench electrode can have a T-shaped structure having a top portion overhanging a lower portion. The top portion of the T-shaped structure can have a greater width than the lower portion, wherein the lower portion is formed within a trench having a trench width. In embodiments, the lower portion of the T-shaped trench electrode can have a width of about 0.5× to about 1.0× of the trench width, while the top portion of the T-shaped trench electrode can have a width greater than the width of the lower portion and about 0.5× to about 1.5× of the trench width. In some embodiments, the top portion of the T-shaped trench electrode can be located at the top of the corresponding trench.

The trench electrode can include metal or metal alloys including, but not limited to, W, WSix, Ti/TiN, doped Polysilicon (N+ or P+ depending on electrode, either doped in-situ while depositing or doped after deposition using diffusion), TaN, TiW, and TiWN. In embodiments, a trench electrode barrier layer can be formed to separate the trench electrode from adjacent semiconductor regions, e.g., active regions or dielectric sidewalls. The trench electrode barrier layer can include a metal-containing material of nitrogen, such as TiN, TiWN, and/or TaN. In embodiments, the Schottky electrode layer can include conductive materials and structures of Ti/TiN, CoSix/TiN, TiW, TiWN, Ni, etc.

In a specific embodiment, a Tungsten (W) trench electrode can used and can be separated from adjacent semiconductor regions by a TiN trench electrode barrier layer, wherein a Ti adhesion layer can be formed between the TiN trench electrode barrier layer and the adjacent semiconductor regions. The exemplary Ti adhesion layer can have a thickness ranging from about 50 angstroms to about 500 angstroms, such as about 150 angstroms. The exemplary TiN trench electrode barrier layer can have a thickness ranging from about 300 angstroms to about 1500 angstroms, such as about 900 angstroms.

Dielectric materials can also be involved in formation of the exemplary clamped power devices. For example, dielectric materials can be used for electrical isolation between active regions and/or can be used as hard mask for implantation or patterning processes as desired. As used herein, the dielectric materials can include, but are not limited to, silicon dioxide (SiO$_2$), silicon nitride (Si$_3$N$_4$), silicon oxynitride (SiON), fluorinated silicon dioxide (SiOF), silicon oxycarbide (SiOC), hafnium oxide (HfO$_2$), hafnium-silicate (HfSiO), nitride hafnium-silicate (HfSiON), zirconium oxide (ZrO$_2$), aluminum oxide (Al$_2$O$_3$), barium strontium titanate (BST), lead zirconate titanate (PZT), zirconium silicate (ZrSiO$_2$), tantalum oxide (TaO$_2$) or other insulating materials.

Various etching techniques including, but not limited to, plasma etching, reactive ion etching (RIE), magnetically enhanced RIE (MERIE), inductively coupled plasma (ICP), transformer coupled plasma (TCP), wet etching, chemical mechanical polishing (CMP), etc., can be used to form exemplary clamped power devices. Specifically, such etching techniques can be used to isotropically and/or anisotropically etch a given material and that the selectivity of a given etch technique can depend on the material being etched and the chemical composition of the etchants.

FIGS. 1A-1G, 2A-2F, 3A-3E, 4A-4D, and 5A-5F depict various methods for forming exemplary power devices in accordance with various embodiments of the present teachings. As will be understood by one of ordinary skill in the art, some additional processing steps and material/doping regions can be included in the described processes based on the semiconductor manufacturing process being used, while other described structures and process steps may be optional and not required to form a functional device. As will also be understood, the parameters of each process step can vary according to the equipment used and the desired layer. In addition, although conductivity or doping types (e.g., P-type or N-type) of materials, regions, or layers of the disclosed power device are specifically discussed, such conductivity or doping types can be reversed based on the specific device application and the semiconductor manufacturing process being used.

Further, although the fabrication processes in FIGS. 1-5 are illustrated for forming a GaN/AlGaN HEMT device, one of ordinary skill in the art will understand that the AlGaN (or GaN) can be replaced by other III-V semiconductors, for example, InAlN, to form a GaN/InAlN HEMT.

FIGS. 1A-1G depict an exemplary power device 100 including a clamp structure of an N+PP+ diode in accordance with various embodiments of the present teachings.

In FIG. 1A, a substrate 110, for example, Si, silicon-on-diamond (SOD), silicon-on-diamond-on-silicon (SODOS), sapphire, diamond, silicon carbide (SiC), etc., is shown, over which a layered active region 234 can be formed. In one embodiment, the substrate 110 can be a silicon substrate having a P-epi layer 114 disposed on a highly doped P+ layer 112. The layered active region 234 can include, e.g., a layer 140 of AlGaN formed on a layer 130 of GaN, which is disposed on a buffer layer or layers 120.

The buffer layer or layers 120 can be formed on the substrate 110. The buffer layers 120 can be formed of, for example, GaN/AlN, AlGaN, AlGaN/AlN, (see above), LT-AlN, HT, AlN, combinations of alternating layers, etc. The buffer layers 120 can have varying thicknesses of about hundreds to about thousands of angstroms and even microns, and can be formed by various known epitaxial growth techniques. In embodiments, the buffer layers 120 can function as a stress relief layer.

Over the buffer layers 120, the exemplary GaN layer 130 can be grown, or in other embodiments the GaN layer 130 can be included as part of the buffer layers 120. The GaN layer 130 can be undoped (intrinsic) or N-type, and can have a thickness of about 0.5 microns to greater than about 2 microns depending on the application. For example, low-voltage RF power applications will most likely use a thinner GaN layer than high-voltage power conversion applications.

The exemplary AlGaN layer 140 can be grown over the GaN layer 130, and can include about 10 wt % to about 28 wt % or to about 30 wt % Al (e.g., about 25 wt %), and undoped. The AlGaN layer 140 can have a thickness of about 150 Å to about 400 Å, for example, about 250 Å. The thickness of the AlGaN layer can impact the channel charge and the pinch-off voltage of depletion mode devices.

In embodiments, the above layers 120, 130, and 140 can be formed by conventional methods, including epitaxial growth by e.g., MOCVD, MBE, etc. Following the growth of the AlGaN layer 140, known techniques for device isolation can be performed.

In certain embodiments, the layered active region 234 for active devices, e.g., in high-voltage power applications can include a thin cap layer (see 140) of GaN with a thickness ranging from about 5 angstroms to about 40 angstroms overlaying a carrier donor layer (see 130) of AlGaN having a thickness ranging from about 100 angstroms to about 400 angstroms with an Al content ranging from about 12 wt % to about 30 wt %. Optionally, a binary barrier or tertiary barrier layer of AlN, e.g., having a thickness of about 5 angstroms to about 20 angstroms, and a Buffer (channel) layer of GaN where the exemplary 2DEG (two dimensional electron gas channel of the HEMT) in the 0.15 micron to 4 micron thick range can be grown on top of stress relief layers (see 120). The stress relief layers can include, e.g., AlN, AlGaN, GaN, low-temp AlN, high-temp AlN, and/or multiple layer stacks of these layers and can have a thickness in the range of about 0.1 microns to about 3 microns. The stress relief layers can be grown on top of the substrate (see 110) such as Si, SiC, Sapphire and/or GaN.

As shown in FIG. 1A, a dielectric mask 150 can then be deposited using known oxide and nitride deposition techniques including, for example, low pressure chemical vapor deposition (LPCVD), plasma enhanced CVD (PECVD), atmospheric CVD (ACVD), sub-atmospheric CVD (SACVD), atomic layer deposition (ALD), etc. Although oxides and nitrides are specifically mentioned herein, other dielectric materials can be appropriate depending on the application, such as oxy-nitrides, silicon-rich oxides, non-silicon based oxides, etc. In embodiments, the dielectric mask 150 can include, for example, one or more dielectric layers (not illustrated).

In embodiments, the dielectric mask 150 can be formed by first blanket depositing a dielectric layer (not shown) over the AlGaN layer 140, followed by a patterning process as known to form the dielectric mask 150.

Figure 1B:
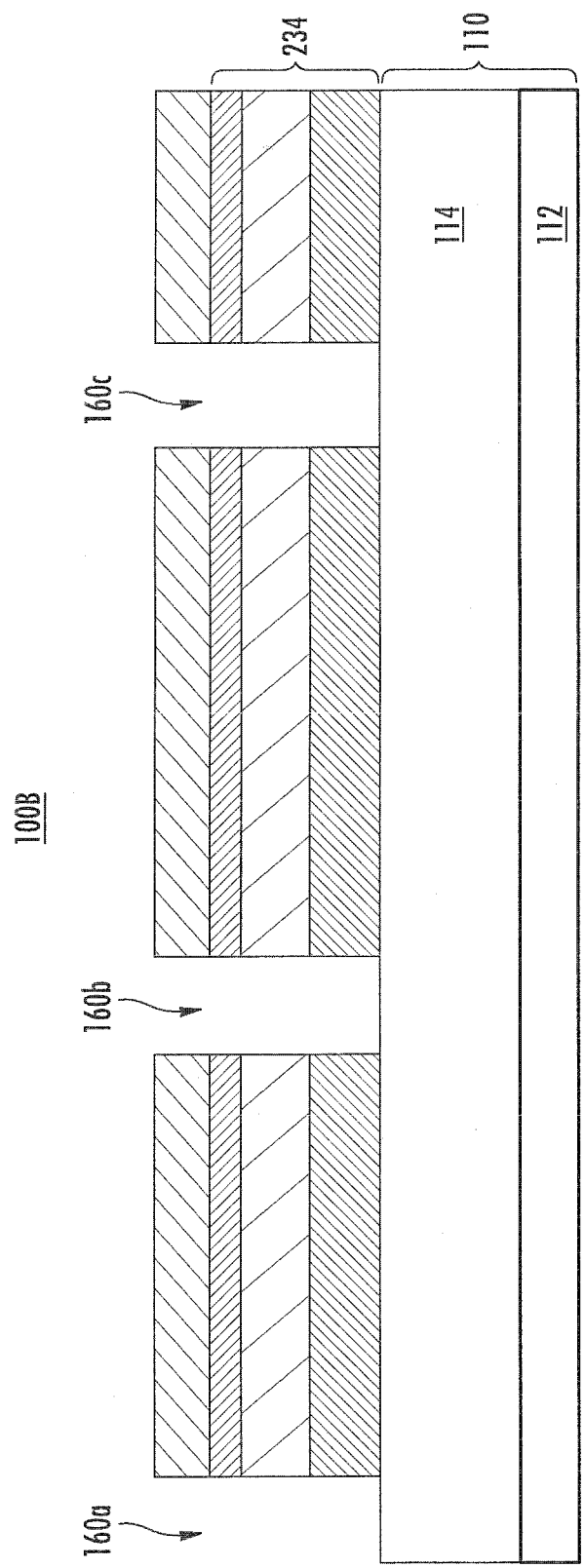

In FIG. 1B, the dielectric mask 150 can be used as a hard mask for forming trenches 160a-c on the P-epi layer 114 through the layered active region 234. Specifically, the dielectric mask 150 can define three corresponding areas, which can be etched to remove portions of the layered active region 234 (e.g., portions of a layered stack of AlGaN/GaN/AlN), to expose portions of underlying P-epi layer 114 of the substrate 110.

Figure 1C:
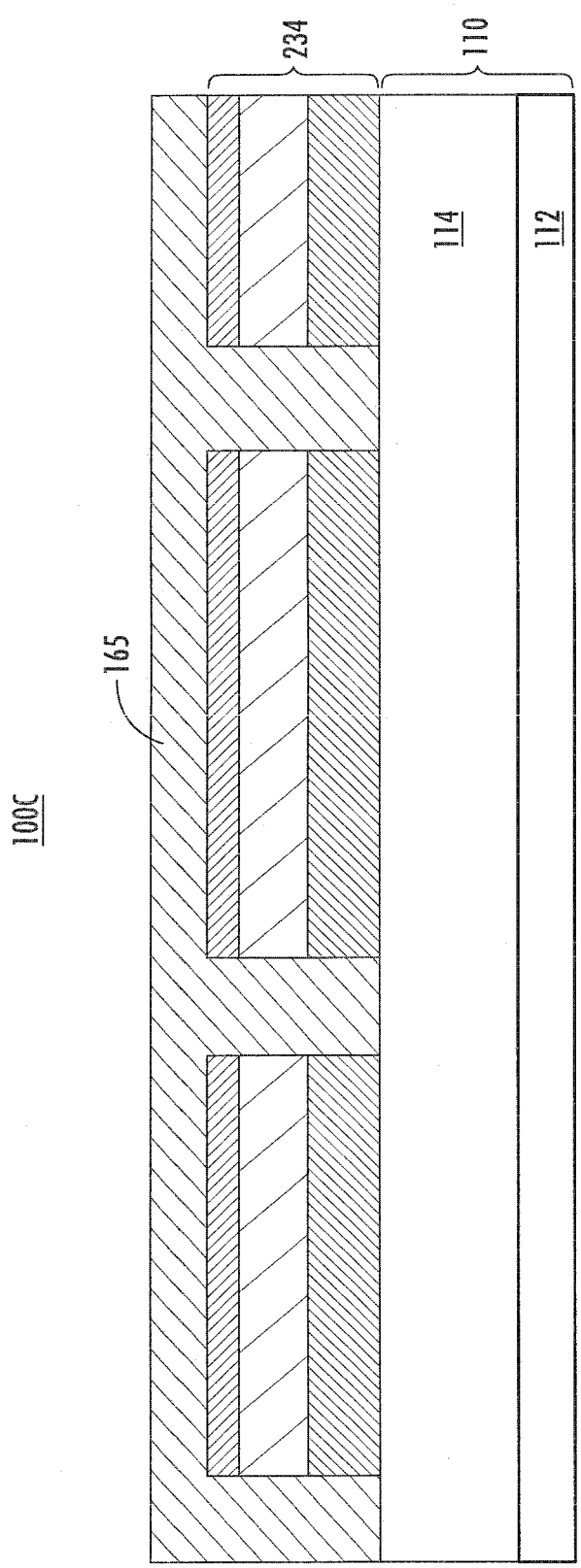

In FIG. 1C, following formation of the trenches 160a-c, the dielectric mask 150 (see FIG. 1B) can be etched away and a dielectric material 165, e.g., an oxide, can be deposited to fill the trenches 160a-c (see FIG. 1B) and on the layer 140.

Figure 1D:
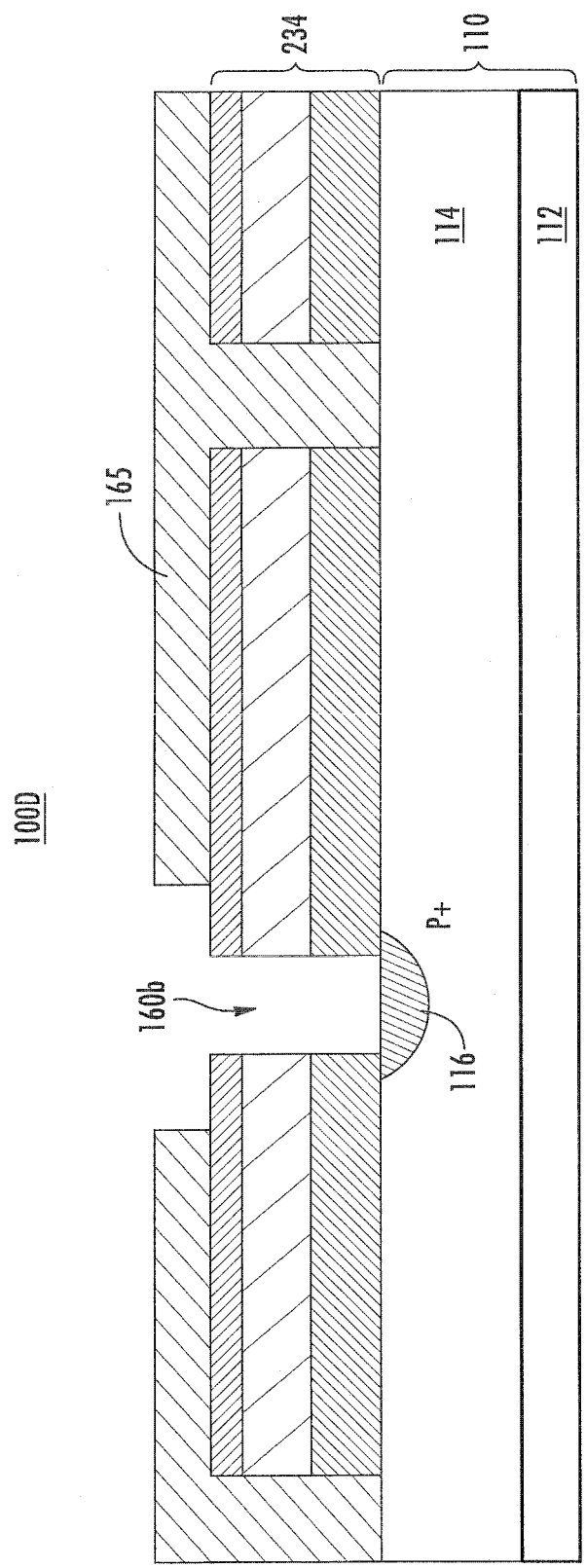

In FIG. 1D, the exemplary dielectric oxide material 165 can be chemically etched to expose the trench 160b and a corresponding portion of the underlying P-epi layer 114. The remaining portion of the exemplary oxide material 165 can be used as an anode mask for forming a P+ diffusion region 116 in the P-epi layer 114 of the substrate 110. In an exemplary embodiment, the P+ diffusion region 116 can be formed by doping boron in the exposed portion of the underlying P-epi layer 114.

Figure 1E:
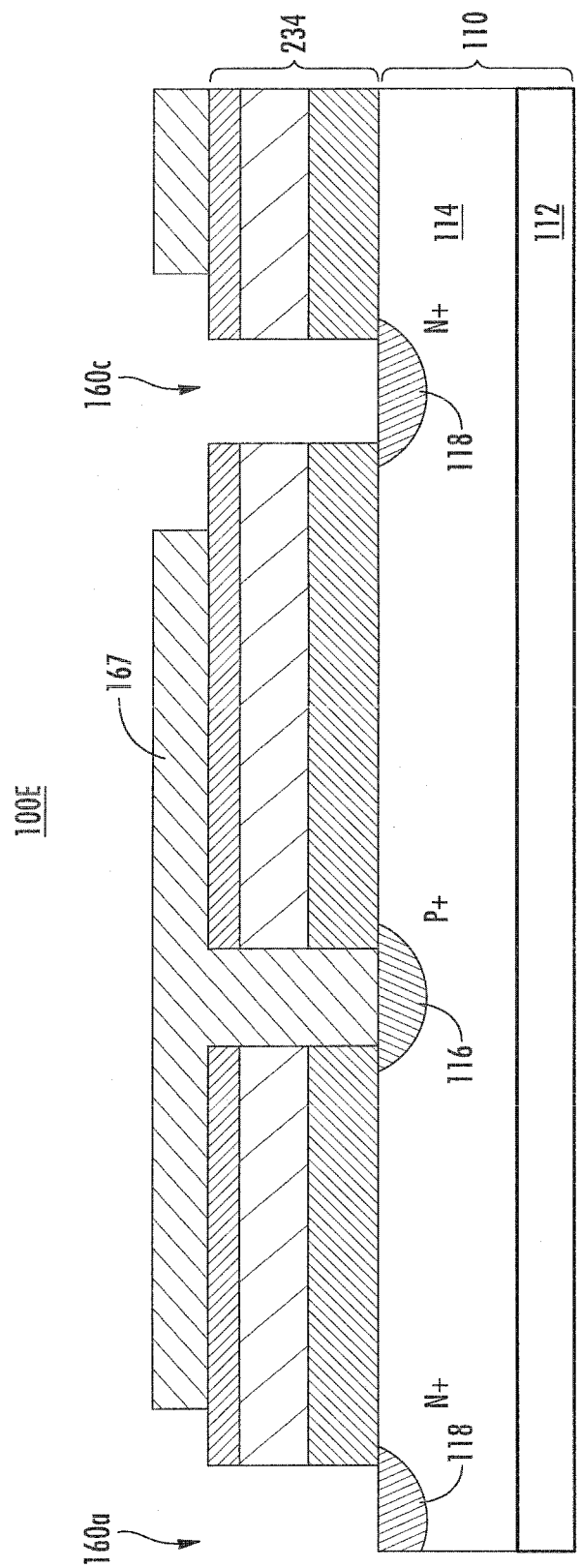
Figure 1F:
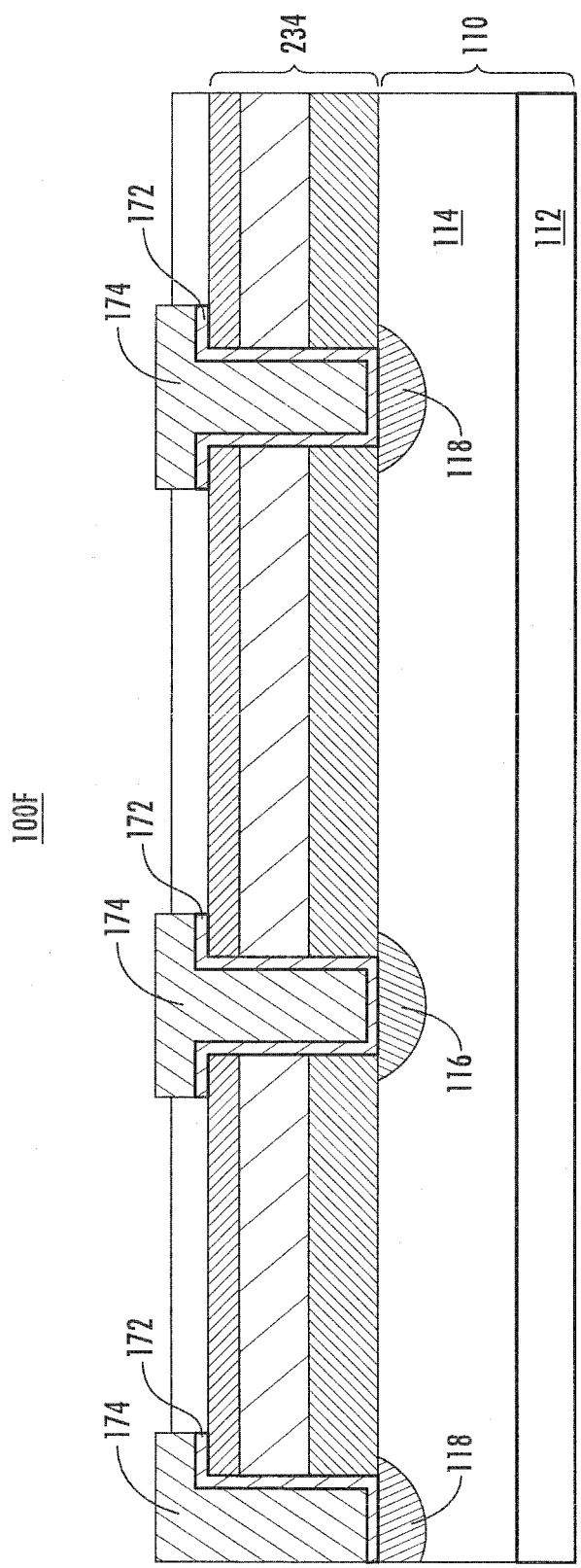

In FIG. 1E, following the formation of the anode P+ diffusion region 116, the trench 160b can be filled by another exemplary oxide material 167. The oxide material 167 can be used as a hard mask, exposing the trenches 160a and 160c for forming an N+ region 118 in the underlying P-epi layer 114 of the substrate 110. The N+ regions 118 can be used as a cathode of the N+PP+ diode integrated in the substrate 110. The N+ regions 118 can be formed by doping the exposed portion of the P-epi layer 114 (through the trenches 160a and 160c) with dopants including As, Sb or Phos.

Following the formation of the cathode N+ regions 118, the oxide material 167 can be removed or etched away, exposing the trenches 160a-c (not shown). As a result, in FIG. 1F, a trench electrode barrier layer 172 can be formed (e.g., patterned) on surfaces of the trenches 160a-c, followed by a deposition of trench electrode conductive material to fill the trenches having the trench electrode barrier layer 172 to form trench electrodes 174. In embodiments, an adhesion layer can be formed between the barrier layer and the adjacent active regions or the barrier layer can be an adhesion layer.

Figure 1G:
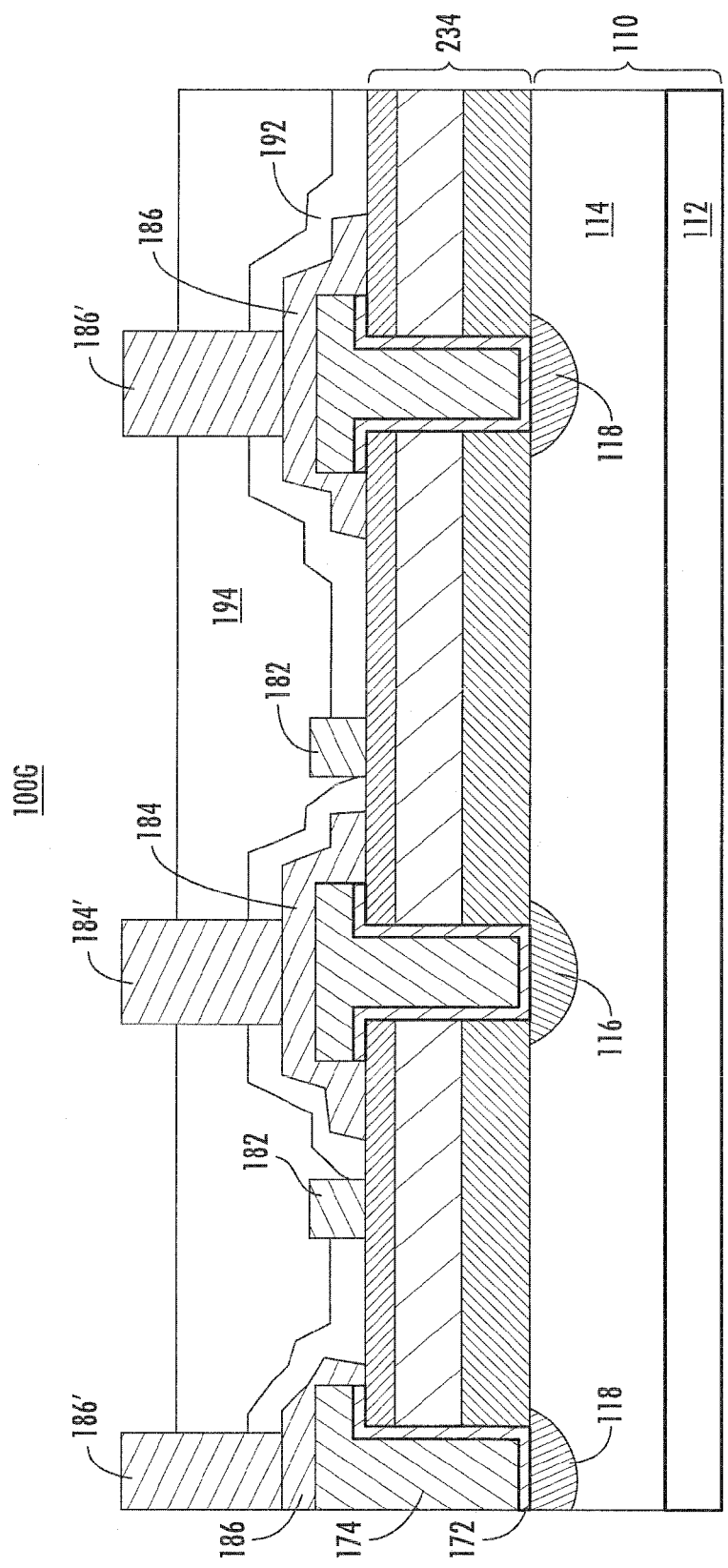

In FIG. 1G, the exemplary power device 100G can be completed using standard materials and methods including, e.g., forming S/D electrodes 184/186 on corresponding trench electrodes 174, depositing an exemplary nitride passivation layer 192 on the S/D electrodes 184/186, forming gate electrode 182 by metal deposition and patterning in the passivation layer 192; depositing an exemplary oxide dielectric 194 on the entire surface of the device, and forming S/D interconnect 184'/186' on corresponding S/D electrode 184/186 through the exemplary nitride passivation layer 192 and through the exemplary oxide dielectric 194.

In certain embodiments, for GaN based active devices such as HEMTs, the S/D electrodes can be formed by depositing Ti/Al/Au over the contact region, patterning this layered metal, e.g., by lifting off, plating and/or etching processes, and annealing at a temperature in the range of 800° C. to about 900° C. The Schottky gate can be formed by depositing Schottky gate metal including Ni, Pt, etc. Insulated gate transistors can be formed by depositing a thin dielectric before depositing and patterning the Gate. The insulator can be oxide, nitride, oxynitride, $Al_2O_3$, $HfO_x$, AlN, etc.

In this manner, an N+PP+ diode including the N+ region 118 in the P-epi layer 114 on the P+ layer 112 can be formed outside (e.g., under) the layered active region 234 but inside the substrate 110, wherein the P+ layer 112 can be grounded for the electrical connection of the formed diode in the substrate 110. Trench electrodes 174 can be disposed on the substrate 110 and through the exemplary GaN-based active region 234 with one trench electrode 174 electrically connecting the drain electrode 186 of the exemplary GaN-based HEMT with a cathode (see N+ region 118) of the N+PP+ diode; and the other trench electrode 174 electrically connecting the source electrode 186 of the exemplary HEMT with an anode (see P+ region 116) of the N+PP+ diode.

In embodiments, the exemplary power device depicted in FIG. 1G can include dielectric sidewalls formed on sidewalls of the trenches 160a-c. The dielectric sidewalls can be formed between the trench electrode 174 and the layered active region 234. For example, FIGS. 2A-2F depict another exemplary power device 200 integrated with an N+PP+ diode at various stages of fabrication in accordance with various embodiments of the present teachings.

Figure 2A:
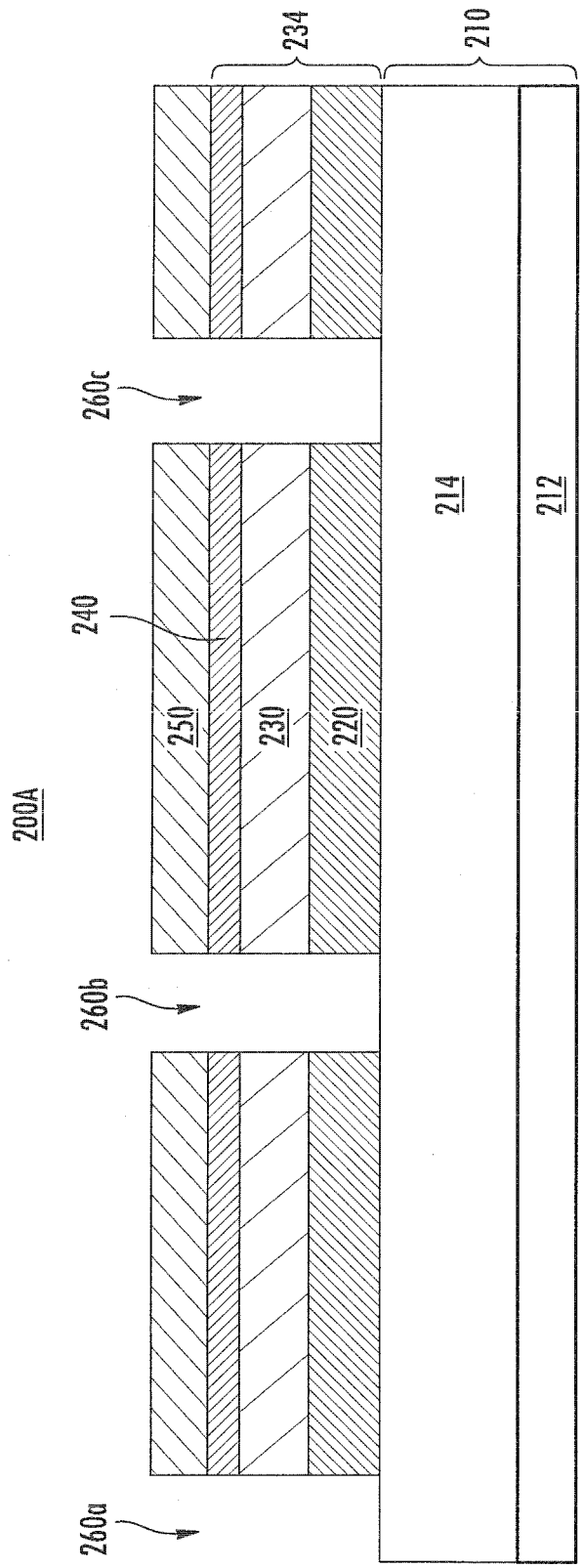
FIGS. 2A-2F depict another exemplary power device integrated with an N+PP+ diode at various stages of fabrication in accordance with various embodiments of the present teachings.

The process of FIGS. 2A-2F can begin with the device shown in FIG. 2A, wherein the device 200A of FIG. 2A has a similar structure as that shown in FIG. 1B. Specifically, the device 200A can include a substrate 210 including a P-epi layer 214 disposed on a P+ layer 212. In embodiments, the doping concentration and thickness of the P-epi layer 214 can be selected based on a desired breakdown voltage. The P-epi layer can have a thickness in the range of about 1 micron to about 20 microns, with a doping in the range of about 1E14 atoms/$cm^2$ to about 1E17 atoms/$cm^2$, to cover a range of about 3 KeV to about 200 KeV. In some cases, thicker P-epi layer and lower doped P-epi layer can extend the substrate breakdown voltage (clamp voltage) to much greater than about 200 V. Over the substrate 210, a layered active region 234, for example, stacked layers of AlGaN/GaN/AlN, can be patterned and can include an AlGaN layer 240 formed on a GaN layer 230, which is formed on a buffer layer 220. Over the layered active region 234, a dielectric mask 250 can be disposed and used as a hard mask for forming trenches 260a-c through the layered active region 234 to expose portions of the P-epi layer 214 of the substrate 210.

Figure 2B:
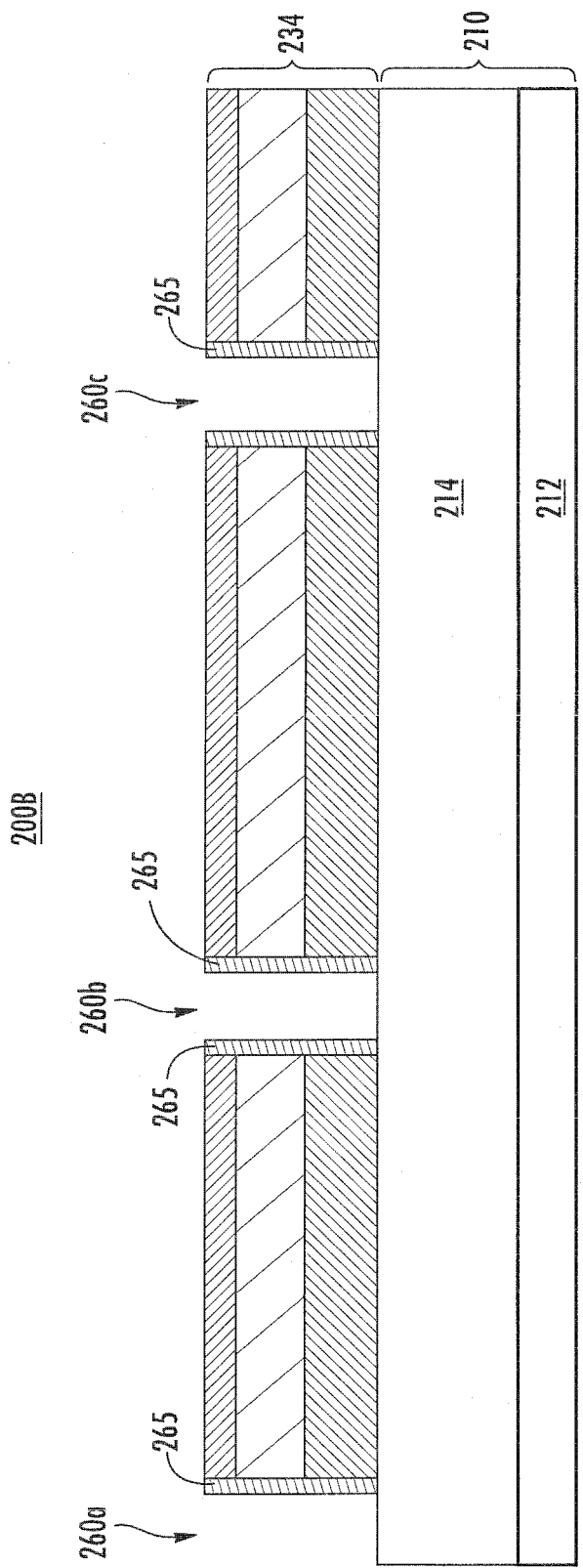

In FIG. 2B, the dielectric mask 250 can be removed to expose the layer 240, followed by a dielectric deposition of, e.g., silicon nitride to form dielectric sidewalls 265 on sidewalls of each trench 260a-c. The dielectric sidewalls 265 can be formed, e.g., by first performing a conformal dielectric deposition to cover the entire surface of the device having the exposed layer 240. Following the conformal dielectric deposition, an anisotropic etching process can be performed to pattern the dielectric deposition, leaving exemplary nitride sidewalls (see 265) on each trench 260a-c.

Figure 2C:
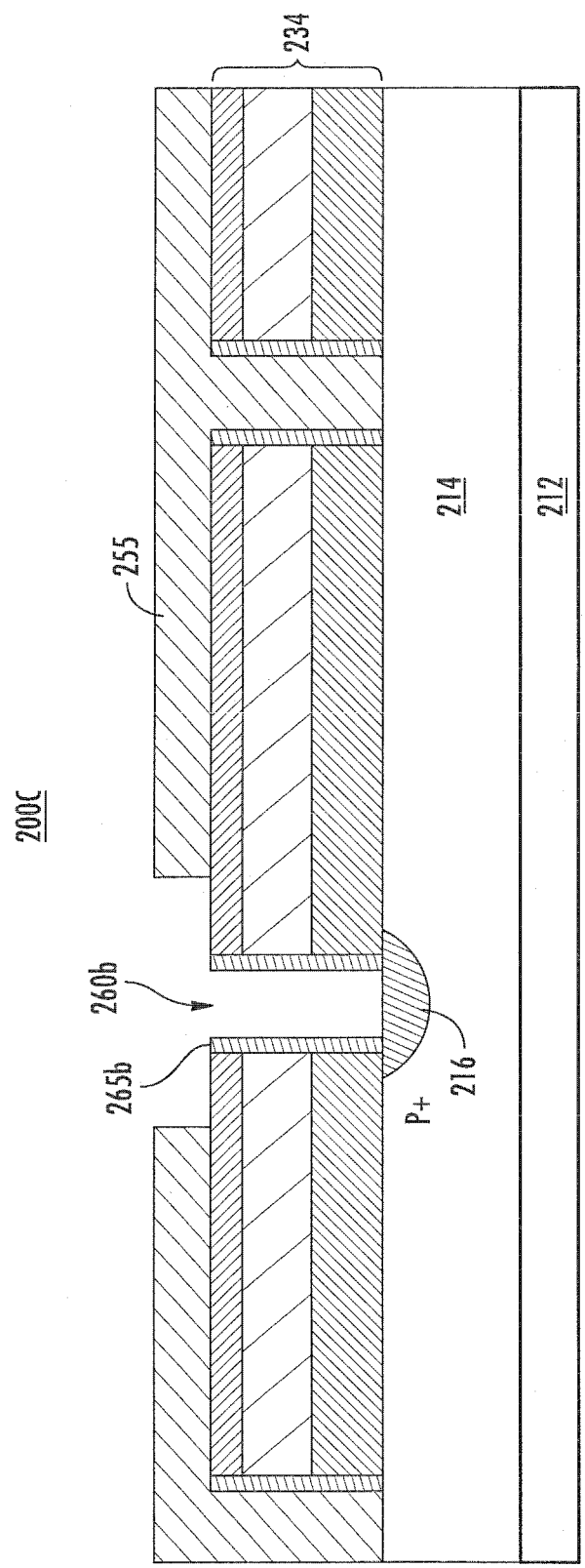

In FIG. 2C, an anode mask 255 can be formed to fill the trench 260a and 260c and expose the trench 260b having exemplary nitride sidewalls 265b. The anode mask 255 can be formed by depositing and patterning a dielectric layer as known to one of ordinary skill in the art. An anode implant can be performed with, e.g., boron, in the P-epi layer 214, forming an anode P+ diffusion region 216 in the P-epi layer 214.

Figure 2D:
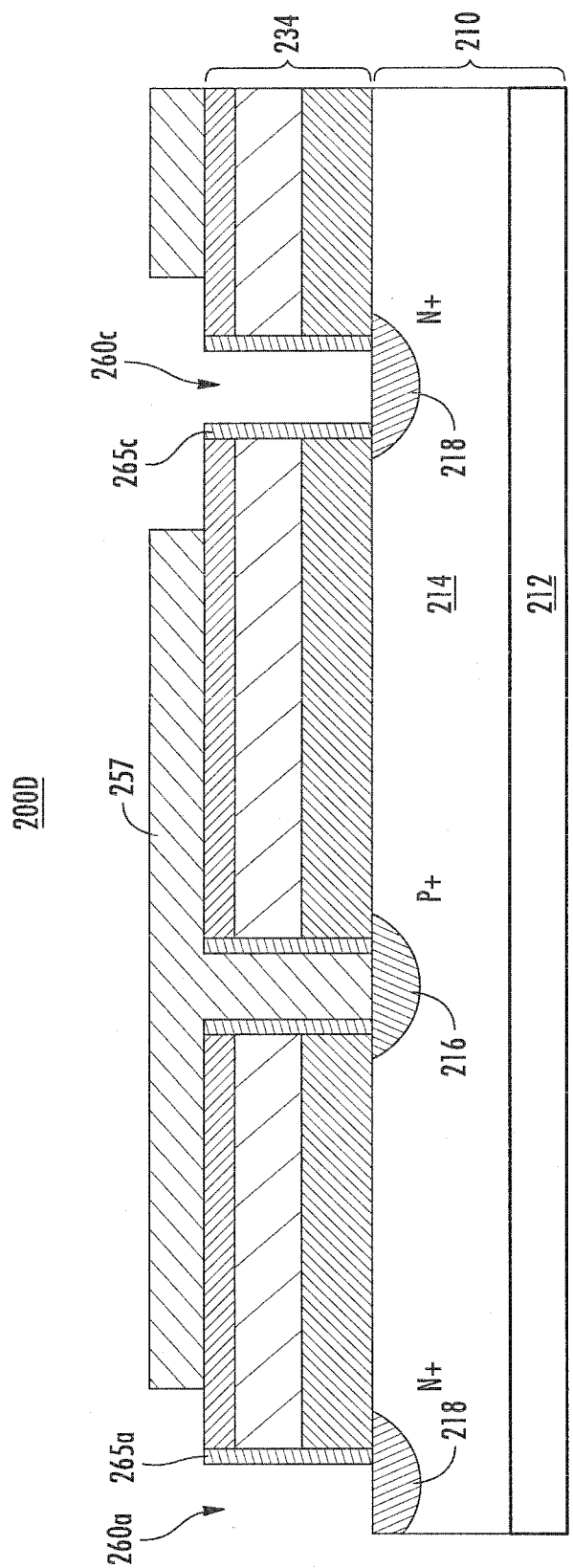

In FIG. 2D, a cathode mask 257 in FIG. 2D, e.g., an oxide layer, can be formed on the layered active region 234 to fill the trench 260b and expose the trenches 260a and 260c, wherein each trench 260a/260c has nitride sidewalls 265a/265c. The cathode mask 257 can be used as an implant mask to dope the exposed portion of the P-epi layer 214 with an N-type dopant to form cathode N+ diffusion regions 218 under the trenches 260a and 260c.

Figure 2E:
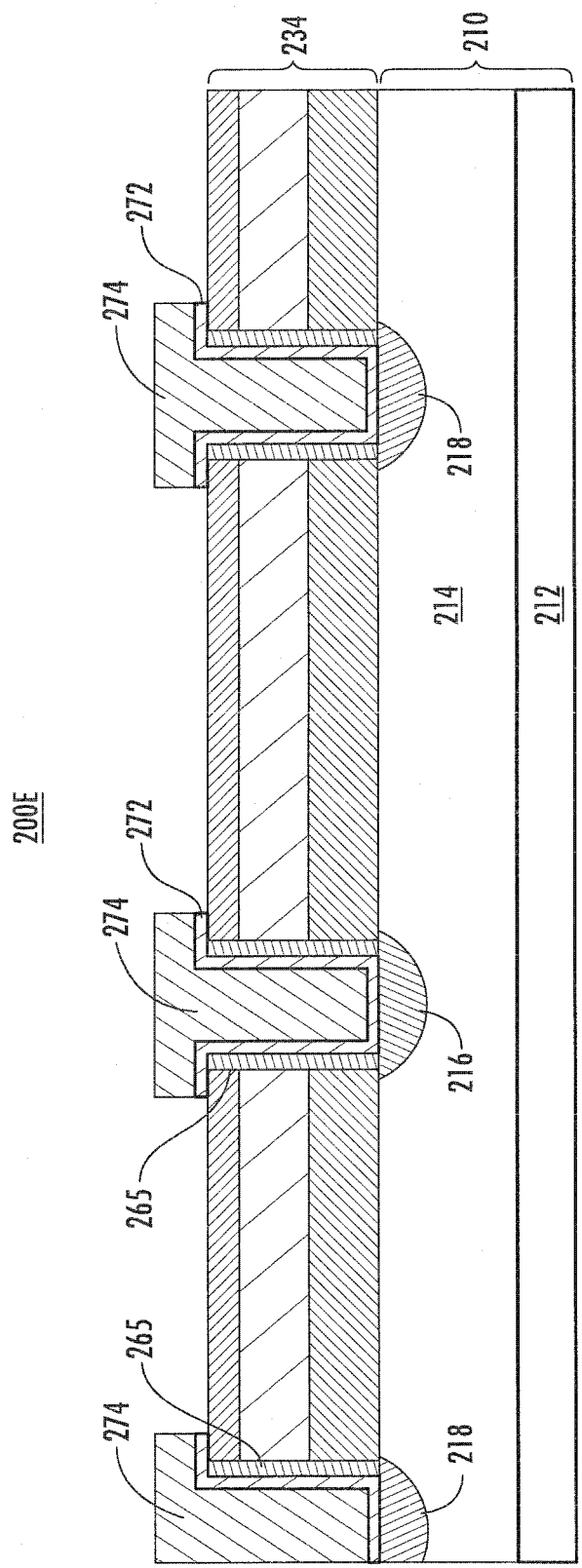

In FIG. 2E, the cathode mask 257 can be removed to expose the trenches 260a-c each having dielectric sidewalls 265. A trench electrode barrier layer 2 can be formed on each surface of the trenches 260a-c with dielectric sidewalls 265. A trench electrode 274 can be formed to fill the trenches having trench electrode barrier layer 272 with conductive materials. For example, the trench electrode 274 can be formed by an electrode deposition followed by a patterning process.

Figure 2F:
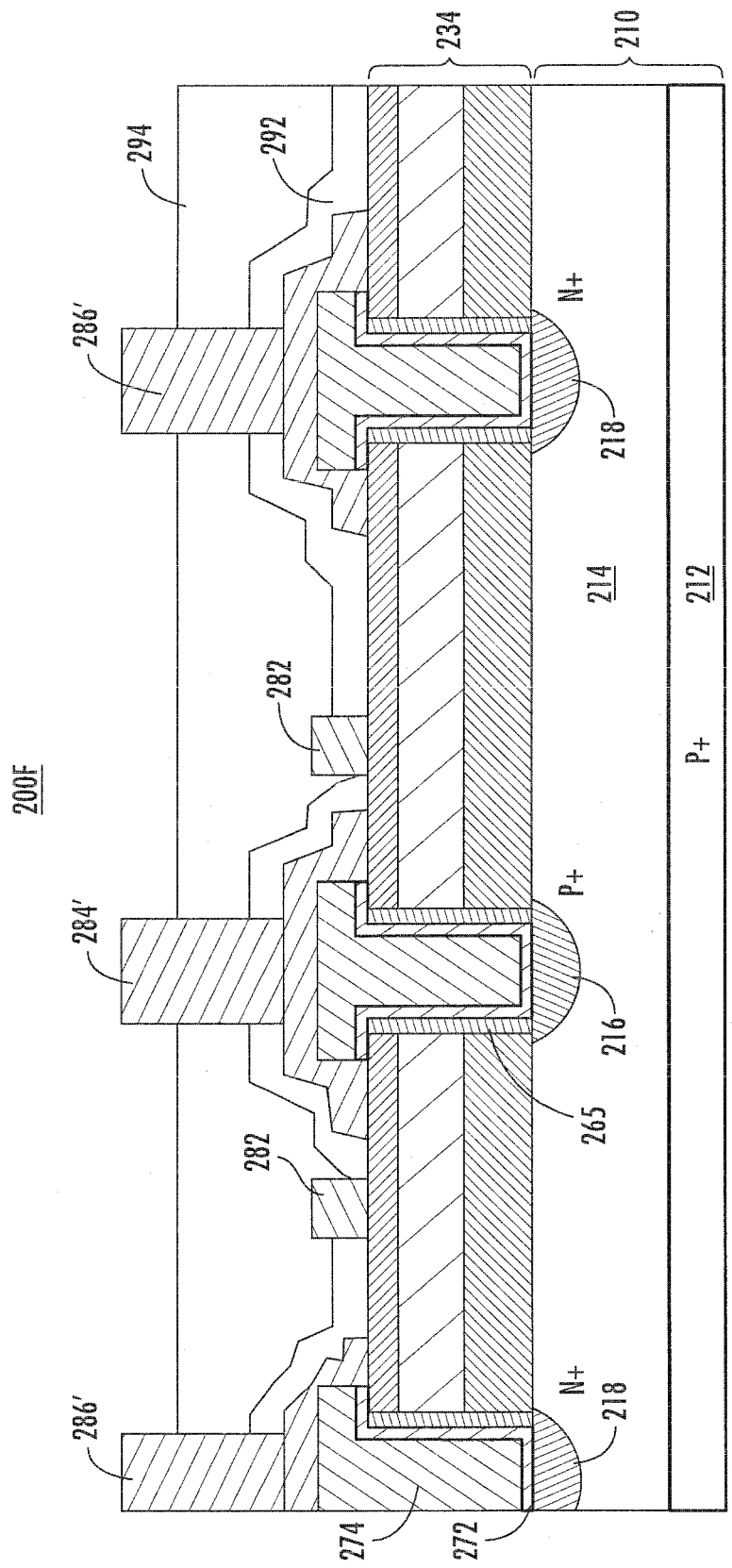

In FIG. 2F, the exemplary power device 200F can be completed using standard materials and methods including, e.g., forming S/D electrodes 284/286 on corresponding trench electrodes 274, depositing an exemplary nitride passivation layer 292 on the S/D electrodes 284/286, forming gate electrode 282 by metal deposition and patterning in the passivation layer 292; depositing an exemplary oxide dielectric 294 on the entire surface of the device, and forming S/D interconnect 284'/286' on corresponding S/D electrode 284/286 through the exemplary nitride passivation layer 292 and through the exemplary oxide dielectric 294.

In embodiments, a P+N⁻N+ clamp structure can be formed outside the device active region within a substrate of a power device in accordance with various embodiments of the present teachings. For example, FIGS. 3A-3E depict an exemplary power device 300 integrated with a P+N⁻N+ diode at various stages of fabrication in accordance with various embodiments of the present teachings.

Figure 3A:
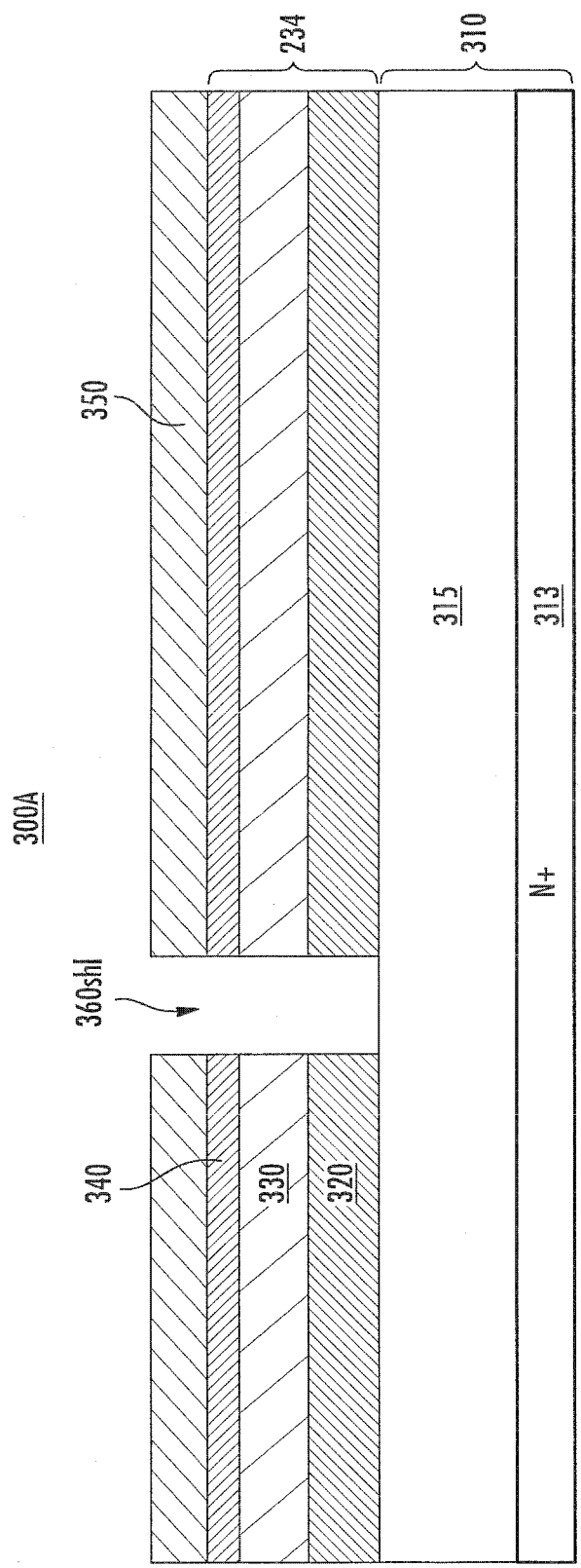

The process of FIGS. 3A-3E begins with the structure shown in FIG. 3A, wherein the device 300A has a similar structure as that shown in FIGS. 1B and 2A, except that the substrate 310 can include an N-epi layer 315, which may have similar doping concentration and/or thickness features as those for the P-epi layers described above, on an N+ layer 313 and except that one trench, e.g., a shallow trench 360shl is formed first through a layered active region 234 and on the substrate 310. As shown, the layered active region 234, can be patterned over the substrate 310. The layered active region 234 can include an AlGaN layer 340 formed on a GaN layer 330, which is formed on buffer layer(s) 320. Over the layered active region 234, a dielectric, mask 350 or layers of dielectric mask, can be disposed and used as a hard mask for forming the shallow trench 360*shl* through the layered active region 234 to expose a portion of the substrate 310, in particular a portion of the N-epi layer 315 of the substrate.

Figure 3B:
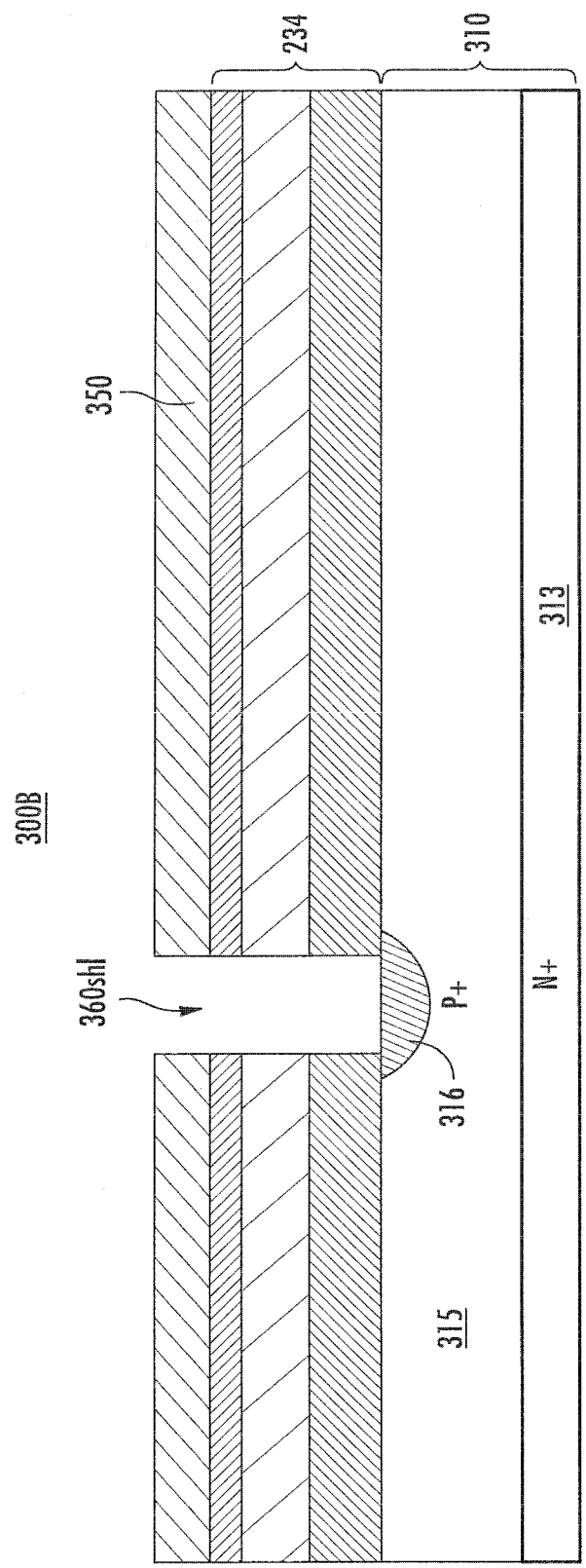

In FIG. 3B, the dielectric mask 350 can be used as a hard mask for an anode doping or implant through the shallow trench 360*shl* to form an anode P+ layer 316 in the substrate N-epi layer 315.

Figure 3C:
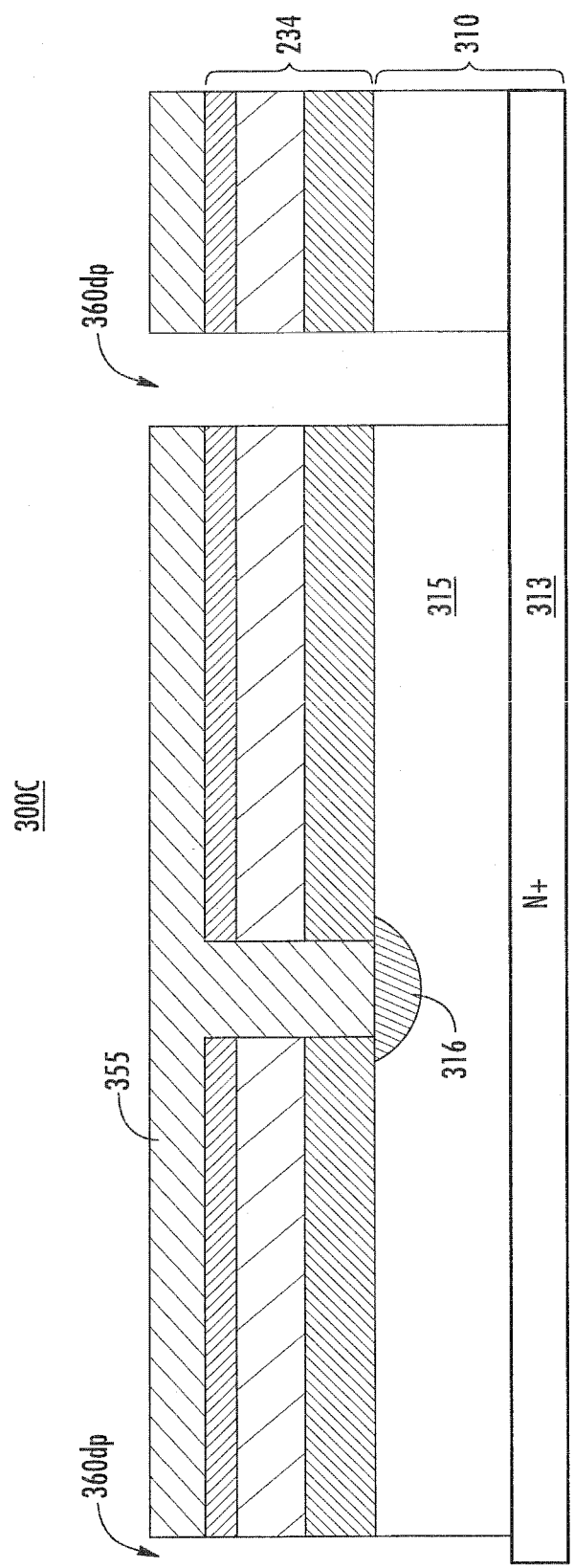

In FIG. 3C, the dielectric mask 350 of FIG. 3B can be removed or etched away to expose the layered active region 234, in particular, the AlGaN layer 340, followed by a conformal dielectric deposition of, e.g., silicon nitride. The exemplary nitride conformal dielectric deposition 355 can fill the shallow trench 360*shl* and formed on the surface of the layered active region 234. The deposited dielectric layer 355 can be used to protect the shallow trench 360*shl* (see FIG. 3B) and to protect active surfaces of the layered active region 234 during the subsequent processes.

Still in FIG. 3C, deep trenches 360*dp* can be formed through the layered active region 234 and further through the N-epi layer 315 of the substrate 310. The deep trenches 360*dp* can be formed on the P+ layer 313 of the substrate 310 using the patterned dielectric layer 355 as a hard mask.

In FIG. 3D, the patterned dielectric layer 355 can be removed from the device 300C of FIG. 3C, followed by a blanket deposition of a trench electrode barrier layer 372. As shown, the trench electrode barrier layer 372 can be formed on the surfaces of the layered active region 234, the shallow trench 360*shl*, and the deep trenches 360*dp*. In embodiments, an anneal process can be performed following the formation, e.g., metal deposition, of the trench electrode barrier layer 372.

Figure 3E:
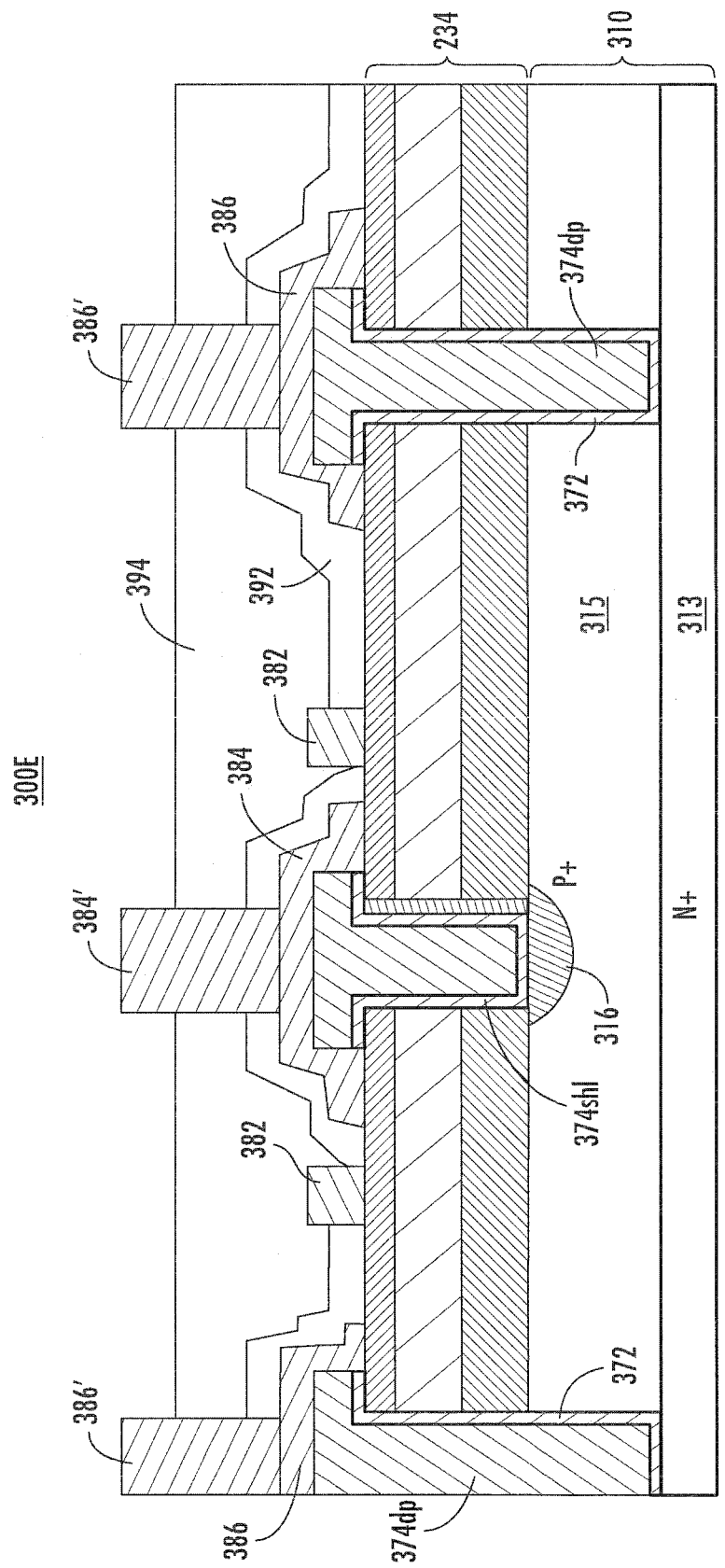

In FIG. 3E, as similarly described in FIGS. 1F-1G and FIGS. 2E-2F, the exemplary power device 300E can be completed by steps including, e.g., depositing and patterning a trench electrode layer and a trench electrode barrier layer to form a shallow trench electrode 374*shl* on the trench electrode barrier layer 372 of the shallow trench 360*shl*, and a deep trench electrode 374*dp* on the trench electrode barrier layer 372 of the deep trench 360*dp*. The exemplary power device 300E can also be completed by steps including forming a source electrode 384 on the shallow trench electrode 374*shl* and forming a drain electrode 386 on the deep trench electrode 374*dp*; depositing an exemplary nitride passivation layer 392 on the S/D electrodes 384/386, forming gate electrode 382 by metal deposition and patterning in the passivation layer 392; depositing an exemplary oxide dielectric 394 on the entire surface of the device; and forming S/D interconnect 384'/386' on corresponding S/D electrode 384/386 through the exemplary nitride passivation layer 392 and through the exemplary oxide dielectric 394.

In this manner as shown in FIGS. 3A-3E, an exemplary P+N⁻N+ or P+NN+ diode including a P+ region 316 in the N-epi layer 315 that is disposed on the N+ layer 313 can be formed outside (e.g., under) the layered active region 234 but inside the substrate 310. The exemplary power device illustrated in FIGS. 3A-3E also include a shallow trench electrode 374*shl* disposed through the exemplary HEMT active region 234 and electrically connecting the source electrode 384 of the exemplary HEMT with an anode (see the P+ region 316) of the exemplary P+N⁻N+ diode; and a deep trench electrode 374*dp* disposed through the active region 234 and further through N-epi layer 315 on the N+ layer 313. In embodiments, dielectric sidewalls (not shown) can be formed between the trench electrode barrier layer 372 and the layered active region 234.

FIGS. 4A-4D depict an exemplary power device 400 integrated with a Schottky diode at various stages of fabrication in accordance with various embodiments of the present teachings.

Figure 4A:
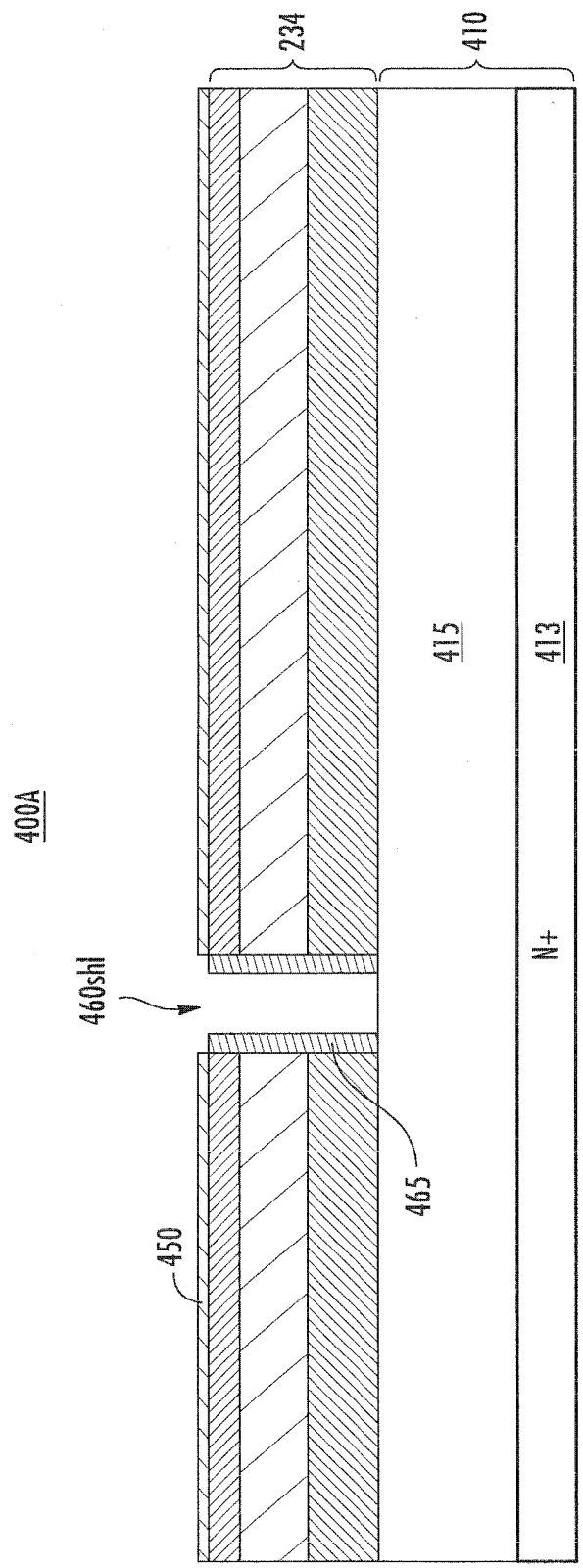
FIGS. 4A-4D depict an exemplary power device integrated with a Schottky diode having trench electrodes with different depths at various stages of fabrication in accordance with various embodiments of the present teachings.

The device 400A of FIG. 4A can take the structure shown in FIG. 3A, wherein a dielectric mask 450 or layers of dielectric mask can be formed on a layered active region 234 (e.g., having stacked layers of AlGaN/GaN/AlN), and the layered active region 234 can be formed over a substrate 410. The substrate 410 can include an N-epi layer 415 disposed on an N+ layer 413. A shallow trench 460*shl* can be formed through the layered active region 234 and on the substrate 410, specifically, on the N-epi layer 415.

Still in FIG. 4A, the shallow trench 460*shl* can have sidewall spacers 465 for forming the Schottky diode. For example, the sidewall spacers 465 can be P-doped polysilicon. The exemplary P-polysilicon sidewall spacers 465 can be formed by depositing polysilicon on the structure shown in FIG. 3A, followed by polysilicon doping process and a polysilicon spacer etch as known to one of ordinary skill in the art. In embodiments, the polysilicon doping process can be performed by tilting and/or rotating implant of, e.g., boron or BF$_2$, in the deposited polysilicon layer followed by optional annealing step and the etching process. In embodiments, the tilted and rotated implant of Boron or BF$_2$ can use an implant dose ranging from about 5E13 atoms/cm$^2$ to about 1E16 atoms/cm$^2$ at an energy ranging from about 10 keV to about 100 KeV at a tilting angle ranging from about 5 degrees to about 45 degrees, for example, ranging from about 7 degrees to about 15 degrees. In some cases, multiple implants, for example, about 4 implants each with ¼ dose can be rotated to cover all polysilicon sidewalls. Alternatively, the polysilicon can be doped "in-situ" during deposition.

Figure 4B:
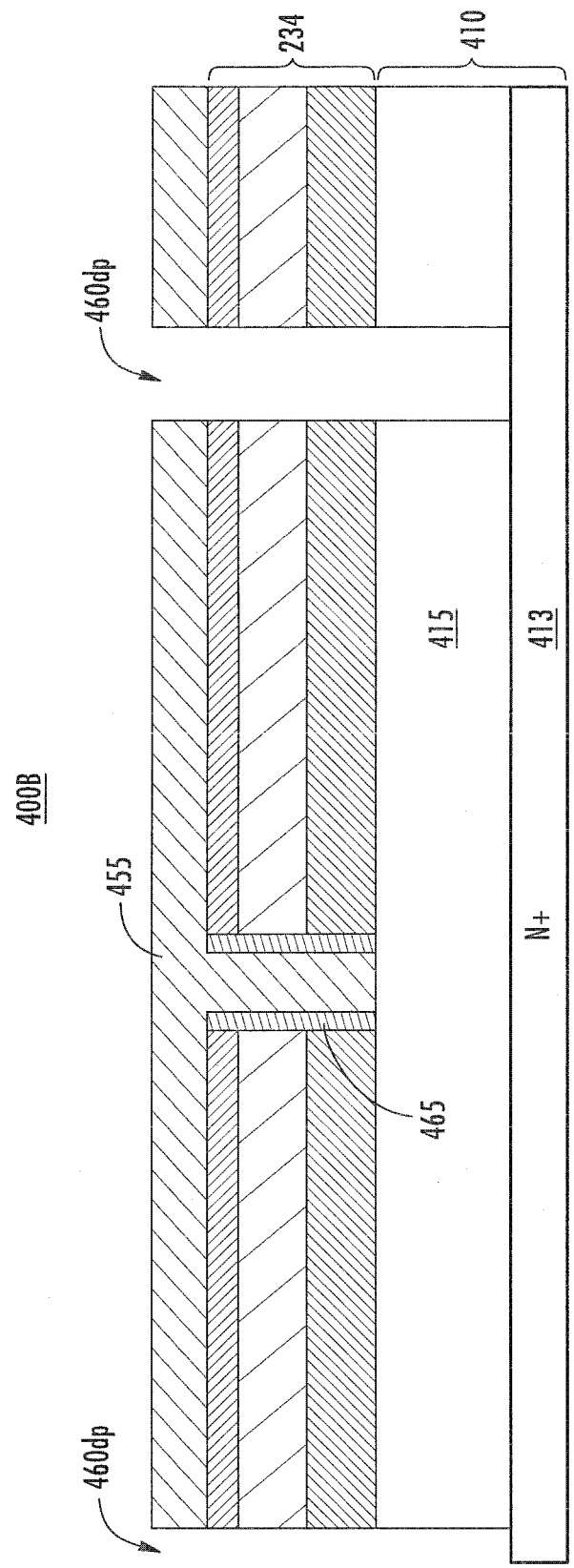

In FIG. 4B, as similarly described in FIG. 3C, a dielectric mask 455 can be deposited to fill and protect the shallow trench 460*shl* (with sidewall spacers 465) and on the surface of the layered active region 234. In addition, deep trenches 460*dp* can be formed on the N+ region 413 and through the layered active region 234 and through the N-epi layer 415 of the substrate 410 using the dielectric mask 455 as a hard mask for forming the deep trenches 460*dp*.

Figure 4C:
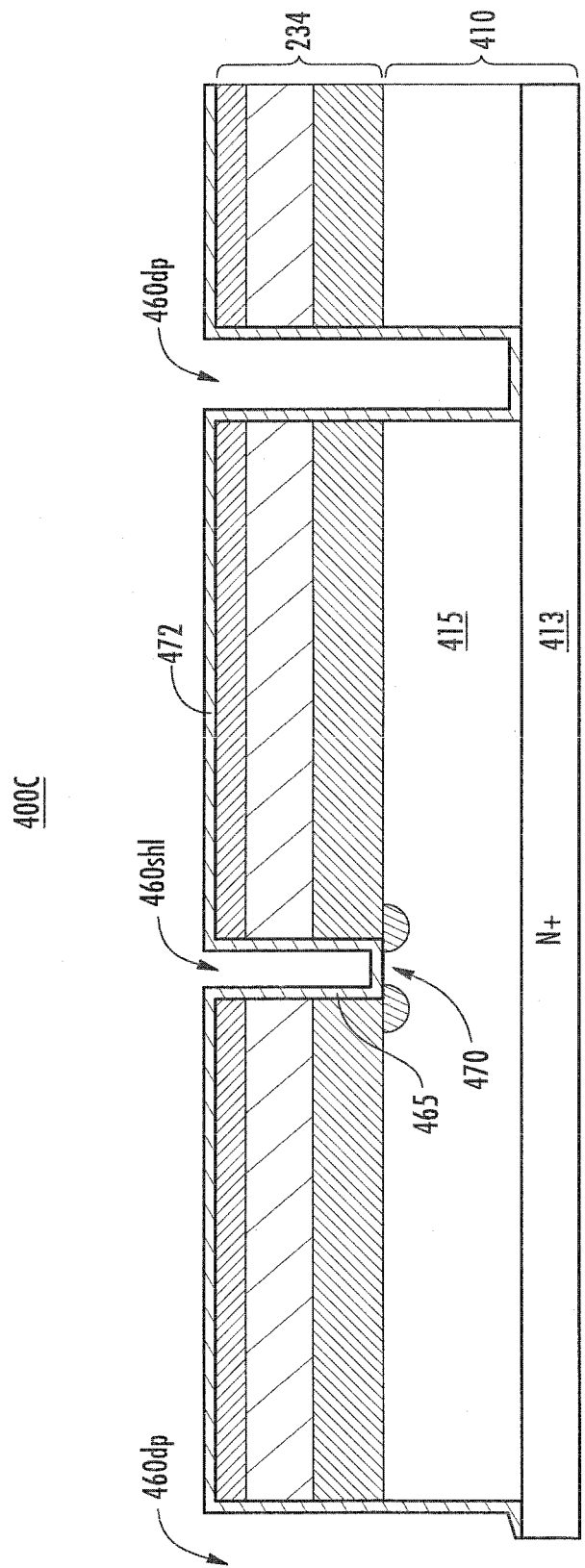

In FIG. 4C, the dielectric layer 455 can be removed from the device 400B of FIG. 4B to expose the layered active region 234. A schottky electrode layer 472 can then be conformally deposited on surfaces of the layered active region 234, the shallow trench 460*shl* with the schottky sidewall spacers 465, and deep trenches 460*dp*. Following the electrode (e.g., metals such as Ti, Ni, Pt, etc.) deposition, an anneal process can be performed to form Schottky electrode at bottom of the shallow trench 460*shl*, for example, at a temperature ranging from about 500° C. to about 800° C. In embodiments, the Schottky diode can include a Schottky region 470 with self-aligned diffused guard rings formed from diffusion of the exemplary P-doped polysilicon sidewall spacers 465 and formed inside the shallow trench 460*shl*.

Figure 4D:
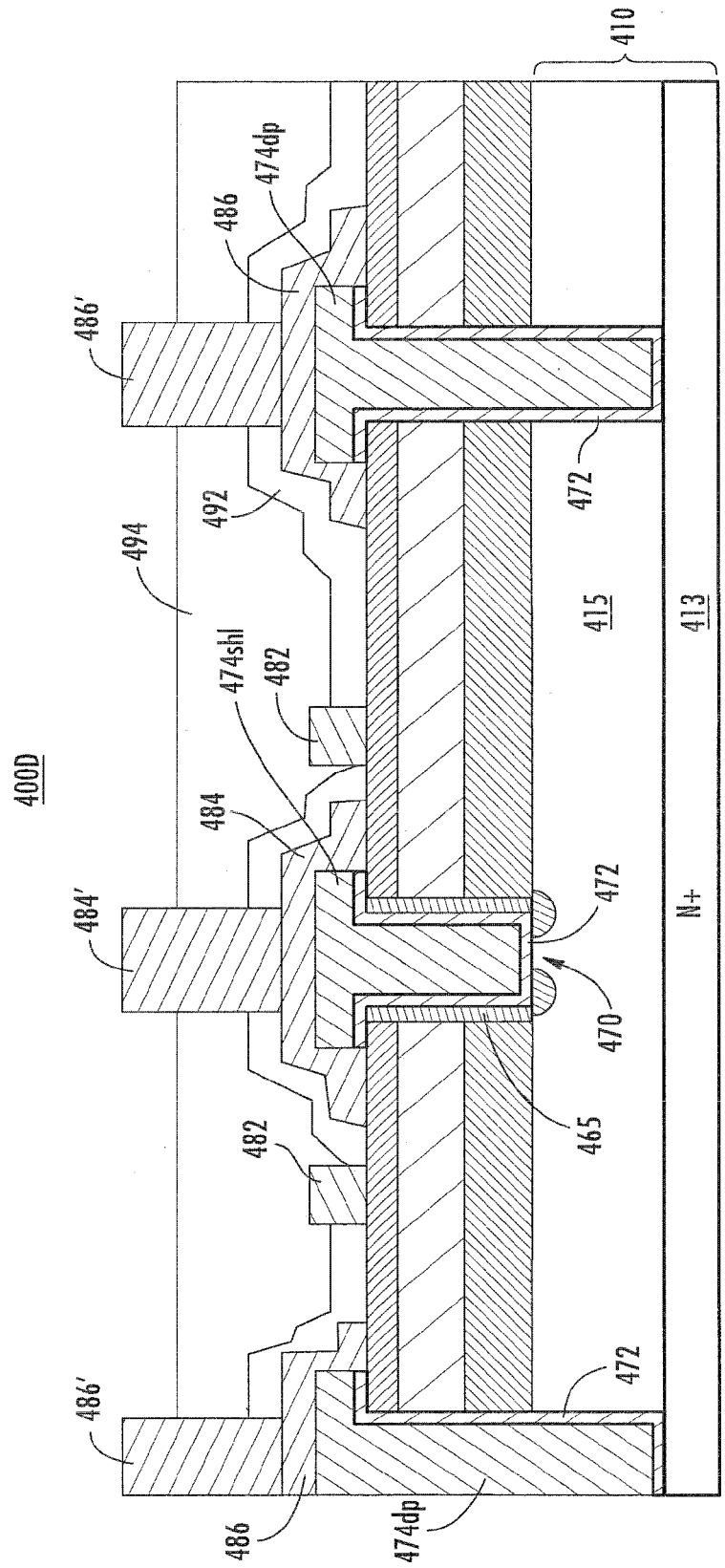

In FIG. 4D, as similarly described in FIG. 3E, the exemplary power device 400D can be completed by steps including, e.g., depositing a trench electrode layer (not shown) on the Schottky electrode layer 472, patterning the trench electrode layer and the Schottky electrode layer 472 to form a shallow trench electrode 474*shl* on a portion of the Schottky electrode 472 in the shallow trench 460*shl*, and a deep trench electrode 474*dp* on another portion of the Schottky electrode 472 in the deep trench 460*dp*. The exemplary power device 400D can also be completed by steps including, e.g., forming a source electrode 484 on the shallow trench electrode 474*shl* and forming a drain electrode 486 on the deep trench electrode 474*dp*; depositing an exemplary nitride passivation layer 492 on the S/D electrodes 484/486, forming gate electrode 482 by metal deposition and patterning in the passivation layer 492; depositing an exemplary oxide dielectric 494 on the entire surface of the device; and forming S/D interconnect 484'/486' on corresponding S/D electrode 484/486 through the exemplary nitride passivation layer 492 and through the exemplary oxide dielectric 494.

In this manner, as shown in FIGS. 4A-4D, Schottky diode structure can be formed on a substrate having an N-epi layer disposed on an N+ layer using trench electrodes having different depths to electrically connect the Schottky diode with the active power device.

In embodiments, instead of having trench electrodes with different depths (i.e., a shallow trench electrode and a deep trench electrode), FIGS. 5A-5F depict an exemplary power device 500 at various stages of fabrication having a Schottky diode electrically connected with the active region by trench electrodes having the same depth for both the cathode and anode in accordance with various embodiments of the present teachings.

Figure 5A:
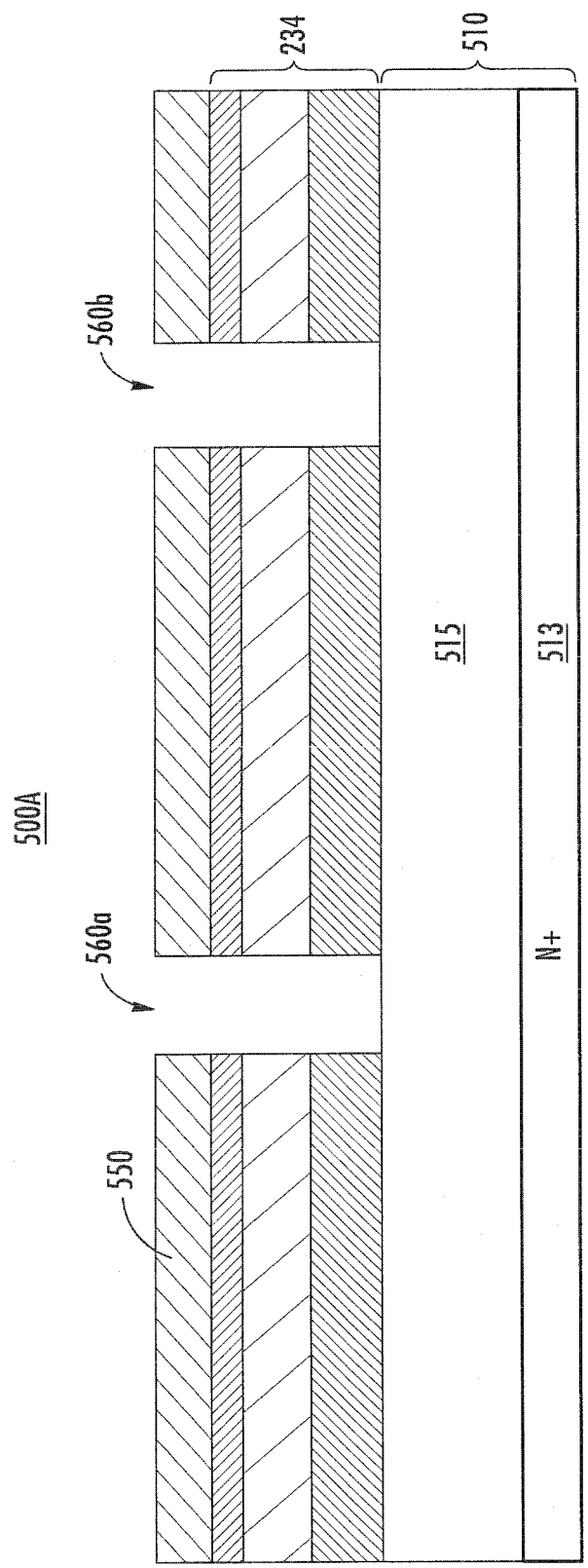
FIGS. 5A-5F depict an exemplary power device integrated with a Schottky diode having trench electrodes with same depth at various stages of fabrication in accordance with various embodiments of the present teachings.

In FIG. 5A, the fabrication process begins with a device 500A having a substrate 510, a layered active region 234, and a dielectric mask 550 or layers of dielectric mask. The substrate 510 can include an N-epi layer 515 disposed on an N+ region 513. The dielectric mask 550 can be formed on the layered active region 234 (e.g., including stacked layers of AlGaN/GaN/AlN), that is formed over the substrate 510. Shallow trenches 560*a-b* can be formed through the layered active region 234 and on the substrate 510, in particular, on the N-epi layer 515.

Figure 5B:
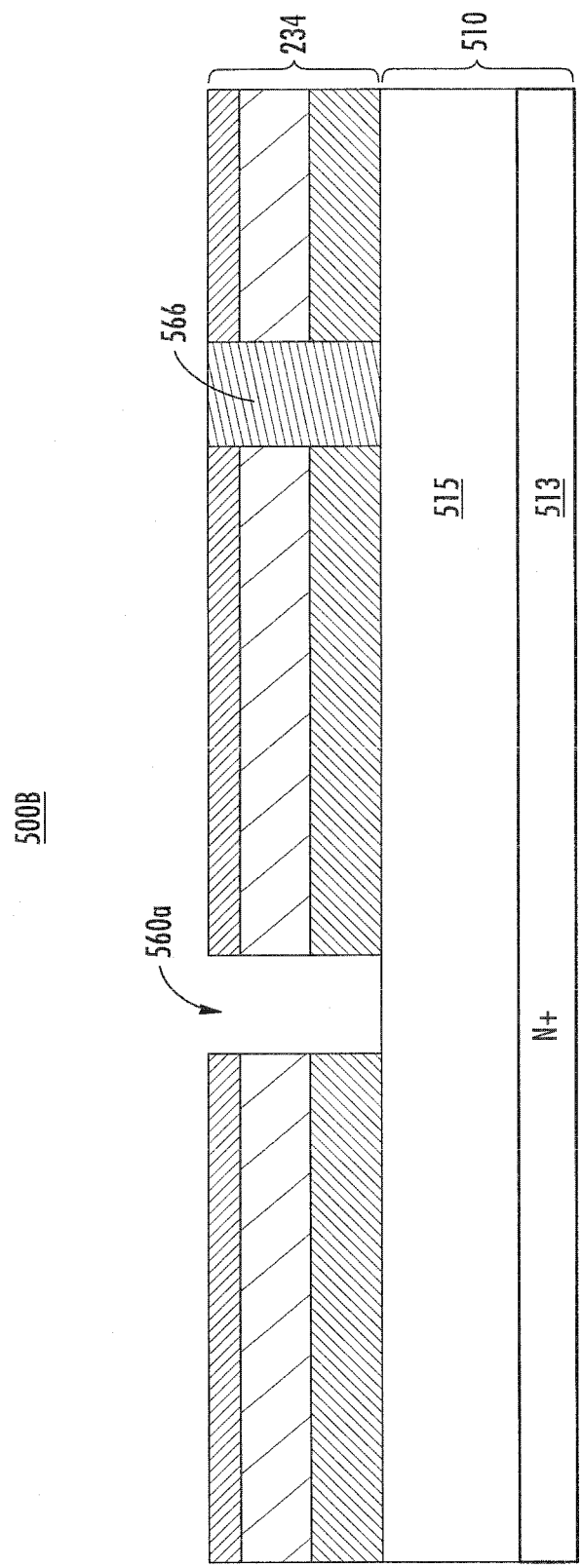

In FIG. 5B, the dielectric mask 550 can be removed to expose the layered active region 234 and a dielectric trench fill 566 can be formed to fill one of the trenches 560*a-b*, for example, the trench 560*b*. The device 500B can be formed using known techniques including, for example, oxide deposition after the removal of the dielectric mask 550, followed by an etch back process to etch oxide from the trench 560*a*.

Figure 5C:
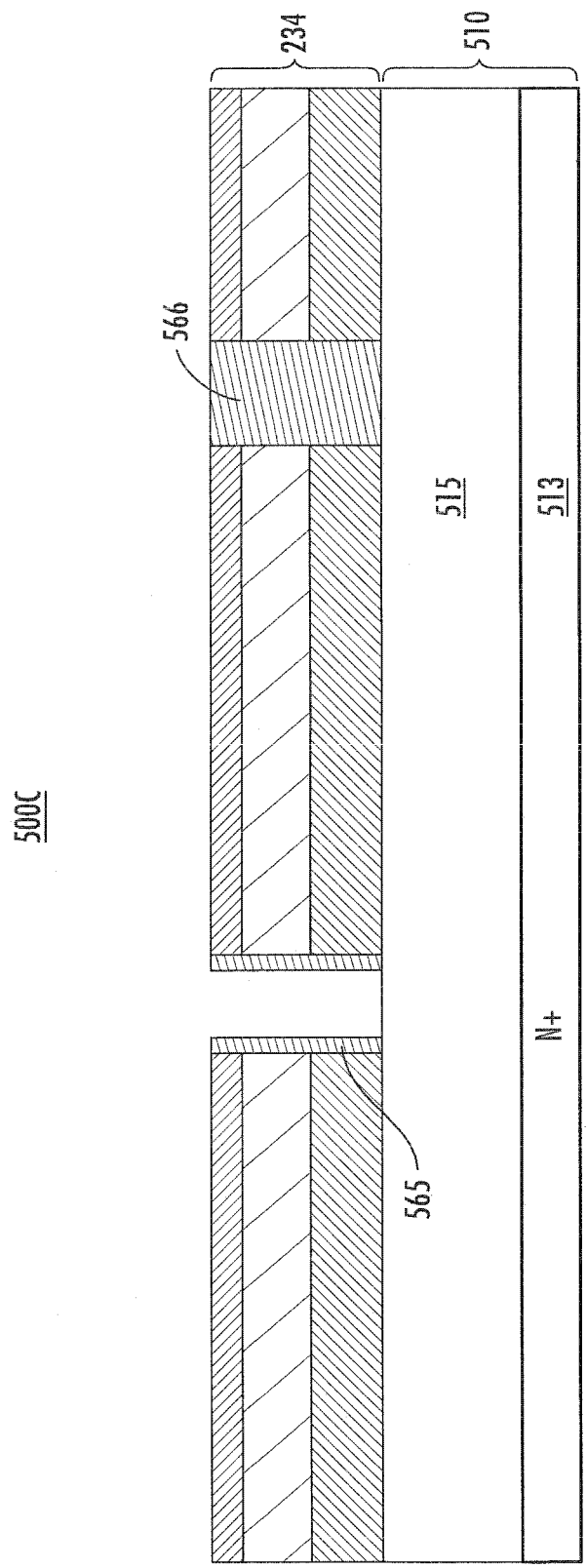

In FIG. 5C, Schottky sidewall spacers 565 can be formed on sidewalls of the trench 560*a*. As similarly described in FIG. 4B, the Schottky sidewall spacers 565 can include, for example, P-doped polysilicon sidewall spacers.

Figure 5D:
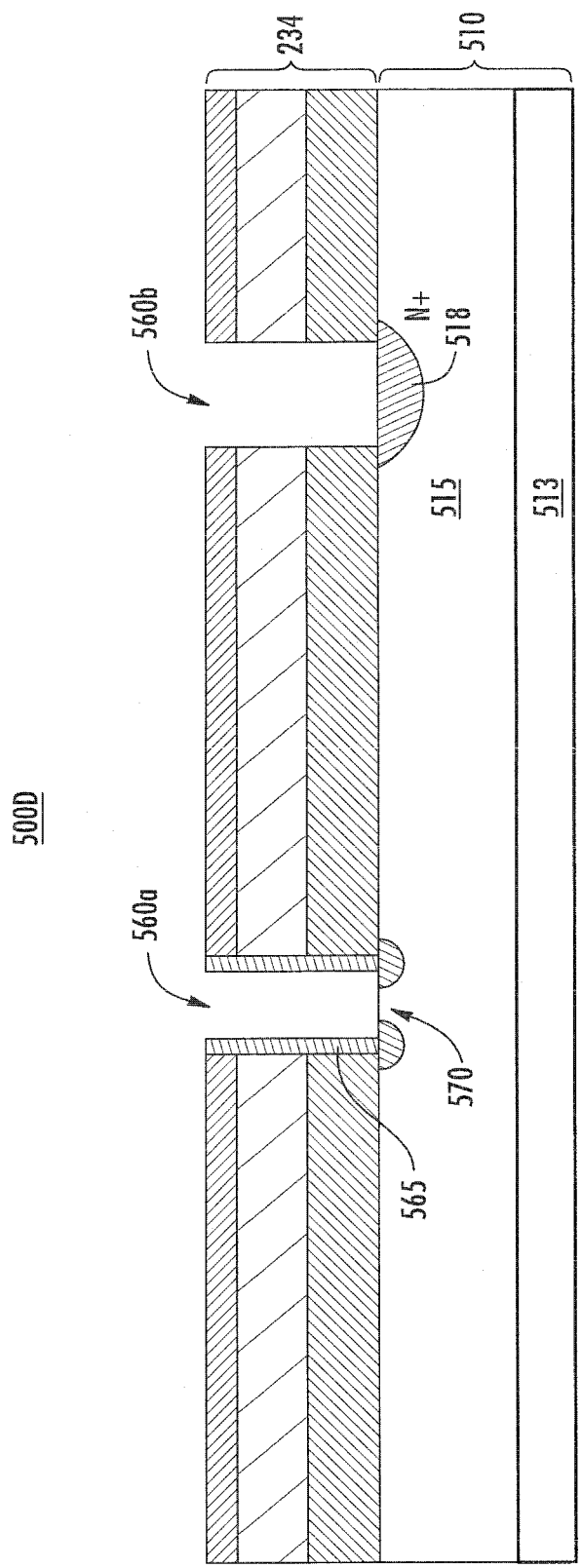

In FIG. 5D, the dielectric trench fill 566 can be removed from the trench 560*b* of FIG. 5C to expose a portion of the underlying N-epi layer 515 of the substrate 510. The exposed portion of the underlying N-epi layer 515 can then be N-doped, followed by an anneal process to form a cathode N+ region 518.

In embodiments, a Schottky region 570 with self-aligned diffused guard rings can be formed from diffusion of the exemplary P-doped polysilicon sidewall spacers 565 and formed inside the shallow trench 560*a*.

Figure 5E:
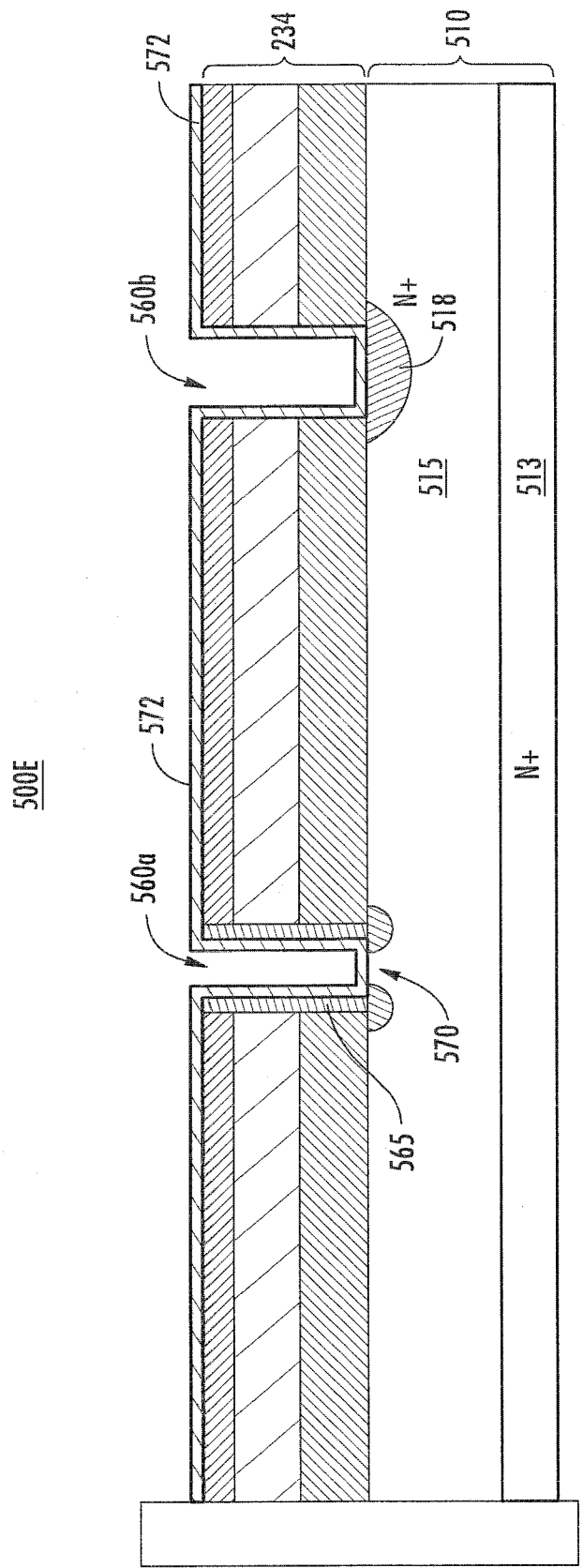

In FIG. 5E, a Schottky electrode layer 572 (also see 472 in FIG. 4) can be conformally deposited on the layered active region 234 having the shallow trench 560*a* with sidewall spacers 565, and the shallow trench 560*b*. Following the electrode deposition, an anneal process can be performed to form Schottky electrode at bottom of the shallow trench 560*a*.

Figure 5F:
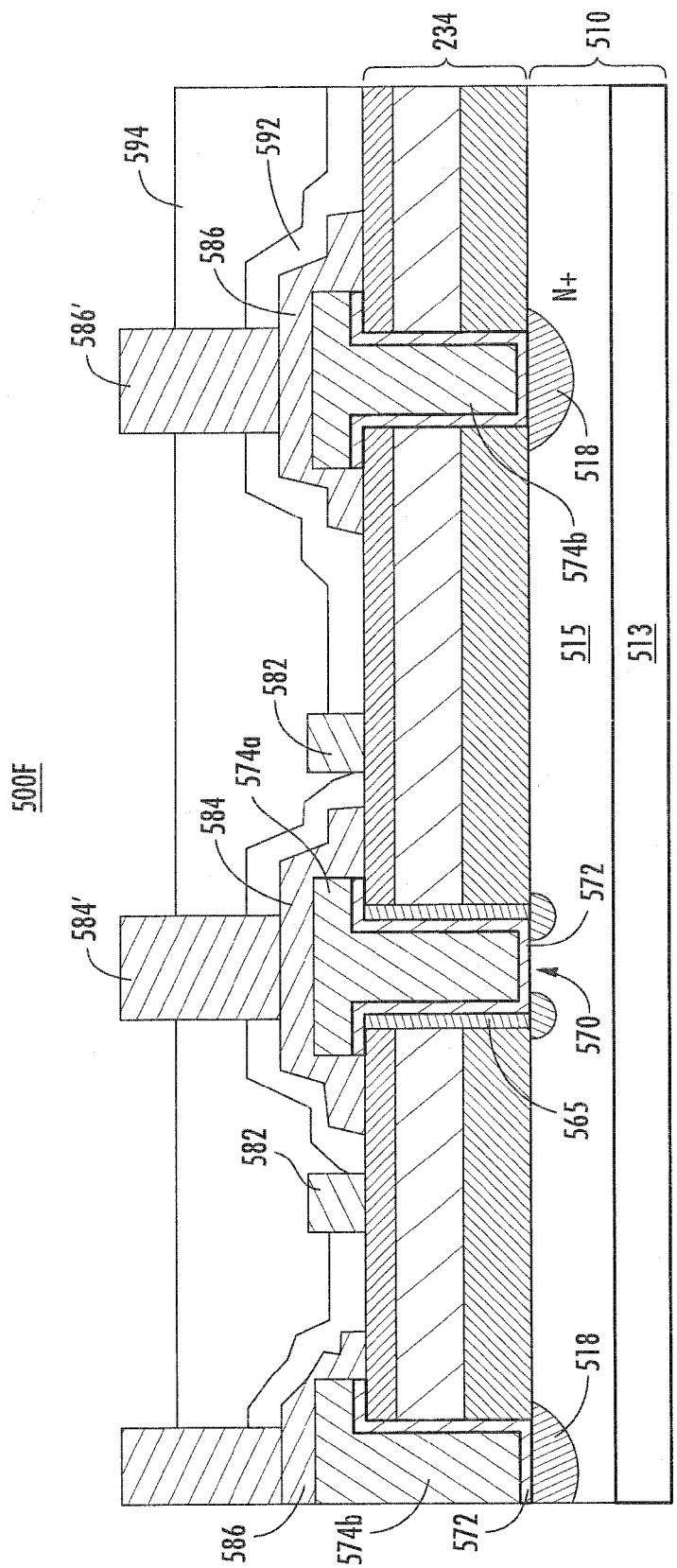

In FIG. 5F, following the formation of the Schottky electrode layer 572, as similarly described in FIG. 4D, the exemplary power device 500 can be completed (not shown) using steps including, e.g., e.g., depositing a trench electrode layer (not shown) on the Schottky electrode layer 572, patterning the trench electrode layer and the Schottky electrode layer 572 to form a trench electrode 574*a* on a surface portion of the Schottky electrode 572 in the shallow trench 560*a*, and a trench electrode 574*b* on another surface portion of the Schottky electrode 572 in the shallow trench 560*b*. The exemplary power device 500F can also be completed by steps including, e.g., forming a source electrode 584 on the trench electrode 574*a* and forming a drain electrode 586 on the trench electrode 574*b*; depositing an exemplary nitride passivation layer 592 on the S/D electrodes 584/586, forming gate electrode 582 by metal deposition and patterning in the passivation layer 592; and depositing an exemplary oxide dielectric 594 on the entire surface of the device.

In this manner, as shown in FIGS. 5A-5F, Schottky diode structure can be integrated on a substrate having an N-epi layer on N+ substrate using shallow trench electrodes with same depth.

In addition to the methods and devices shown in FIGS. 1-5, various additional exemplary clamp structures can be incorporated outside the power device active regions to protect terminals of the disclosed power devices from EOS, as shown in FIGS. 6, 7A-7B, 8-10, 11A-11B, 12-13, 14A-14B, and 15-16.

For example, the substrate of the clamped power devices shown in FIGS. 6-10 can include a P+ layer and can be grounded. Such grounded substrate can be used as an anode of the clamp structure formed within the substrate. The cathode of the clamp structure can be formed between drain regions of the power device.

Figure 11B:
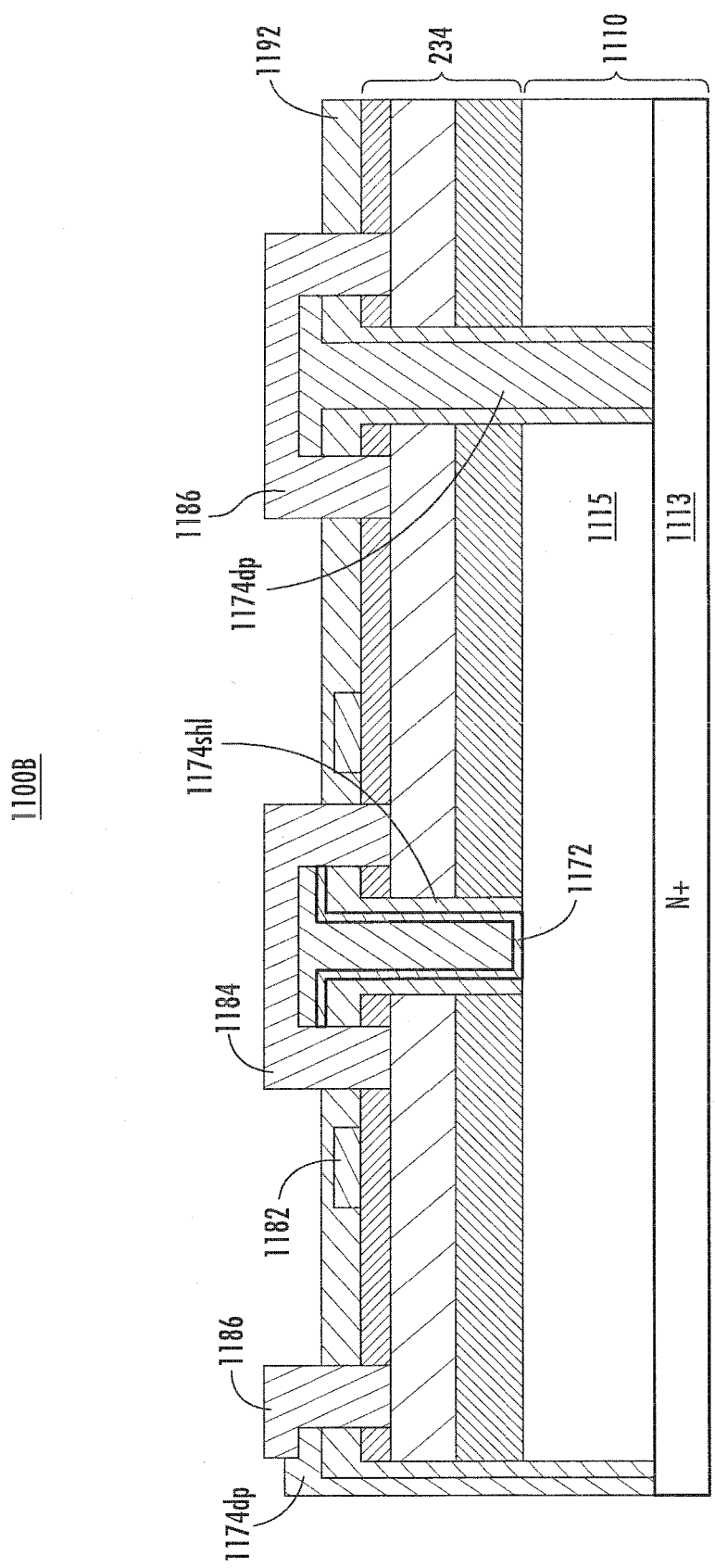
FIG. 11B depicts an exemplary power device integrated with a Schottky diode in accordance with various embodiments of the present teachings.

In another example, the substrate of the exemplary power device in FIG. 11A can include a substrate drain, which can be used as cathode of the clamp structure formed within the substrate. In additional examples, the exemplary power device in FIG. 12 can include striped clamps and the exemplary power devices in FIGS. 11B, 15A-B, and 16 can include Schottky diodes. In embodiments, the striped clamps or Schottky diodes can be configured continuously over the entire width of the exemplary FET (field-effect transistor) cell along the source region or along the drain region. In other embodiments, the striped clamps or Schottky diodes can be configured non-continuously or interrupted along the entire width of the FET cell between source fingers or between drain fingers. The Schottky diodes can have self-aligned P-guard ring at periphery. In embodiments, in addition to using silicon substrate, the substrate can include SOD or SODOS as shown in FIGS. 13, 14A-B, and 16.

Figure 6:
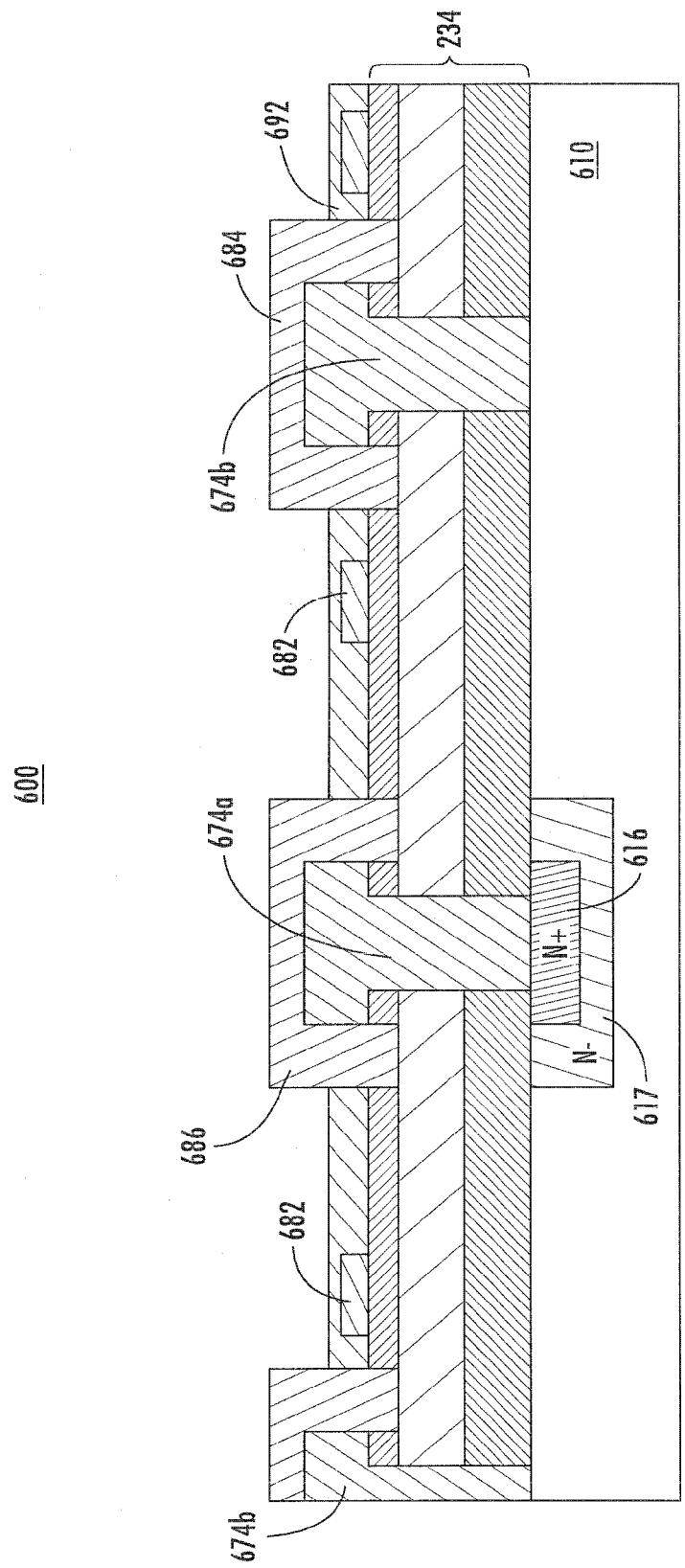
FIG. 6 depicts an exemplary power device integrated with a PN diode in accordance with various embodiments of the present teachings.

Specifically, FIG. 6 depicts a cross-sectional view of an exemplary device 600 integrated with an exemplary PN diode in accordance with various embodiments of the present teachings. As shown, the device 600 can include a substrate 610, and a layered active region 234 disposed over the substrate 610.

The layered active region 234 can include, e.g., stacked layers of AlGaN/GaN/AlN, as disclosed herein. The substrate 610 can be a P+ substrate having a cathode N+ region 616. The cathode N+ region 616 can be formed in an N$^-$ region 617, which is also located in the P+ substrate 610. A PN diode can then be formed. In exemplary embodiments, the N$^-$ region 617 can be formed by a medium to low dose of Phos implant ranging from about 1E11 atoms/cm$^2$ to about 1E14 atoms/cm$^2$, followed by an anneal process.

A first trench electrode 674*a* can also be formed through the layered active region 234 on the substrate 610 to electrically connecting a drain electrode 686 of the active device of, e.g., a HEMT, with the cathode N+ region 616 of the PN diode in the substrate 610. A second trench electrode 674*b* can be formed through the layered active region 234 on the P+ substrate 610 to electrically connecting a source electrode 684 of the exemplary active device with the P+ substrate 610. The active device can also include gate electrodes 682 formed by metal deposition and patterning in a passivation layer 692, as similarly described for the device 500E in FIG. 5E.

The exemplary power device 600 can thus include a PN diode clamped drain, while the P+ substrate 610 can be used as anode of the PN diode when grounded. The P+ substrate 610 can also be used as the device source connected by the second trench electrode 674b.

Figure 7A:
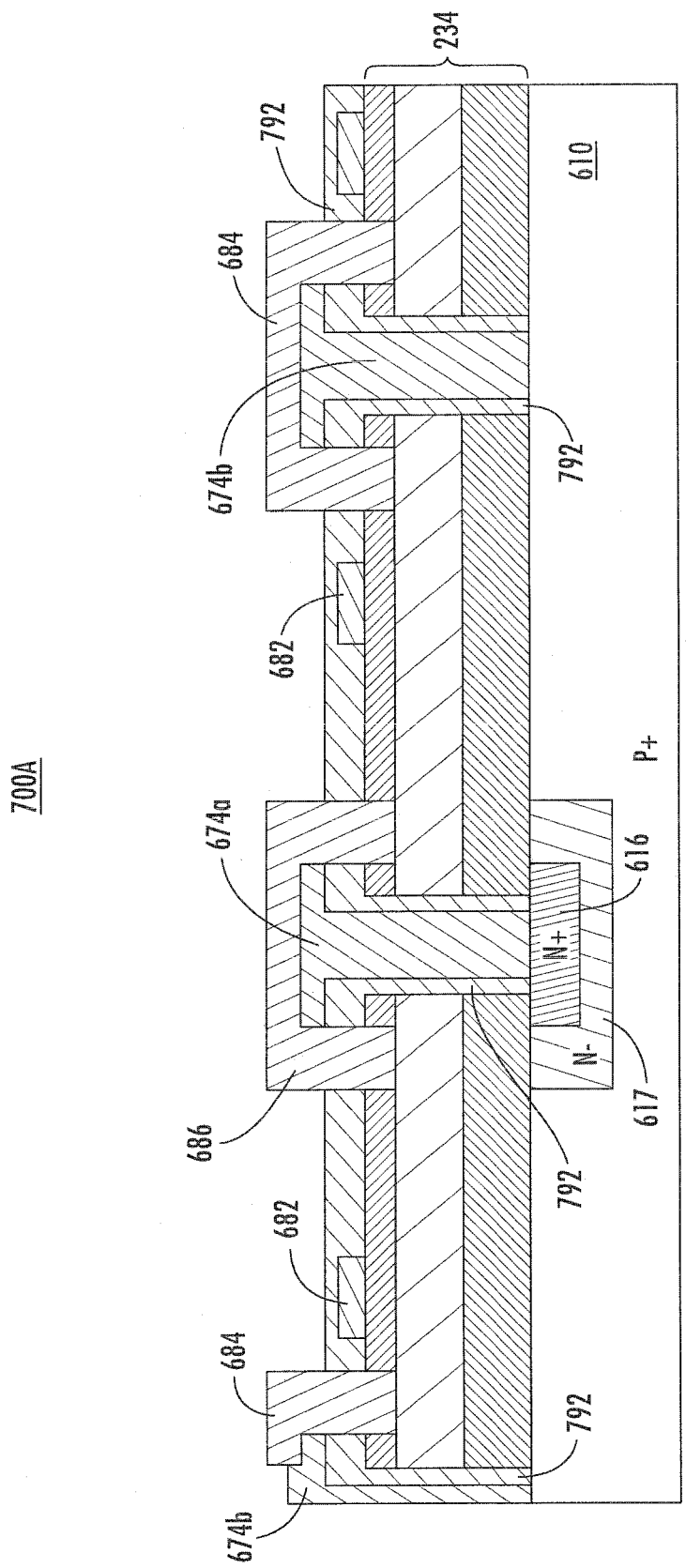

FIGS. 7A-7B depict an exemplary power device 700 integrated with a PN diode having similar structure as shown in FIG. 6, except that dielectric sidewalls 792 can be formed between each trench electrode 674 and the layered active region 234. In embodiments, a trench electrode barrier layer (not shown) can be formed between each trench electrode 674 and the dielectric sidewalls 792 or between each trench electrode 674 and the layered active region 234 where the dielectric sidewalls 792 are absent (see FIG. 6). As shown in FIG. 7B, the PN diode can be formed in the isolation regions 792 between active device cells.

Figure 8:
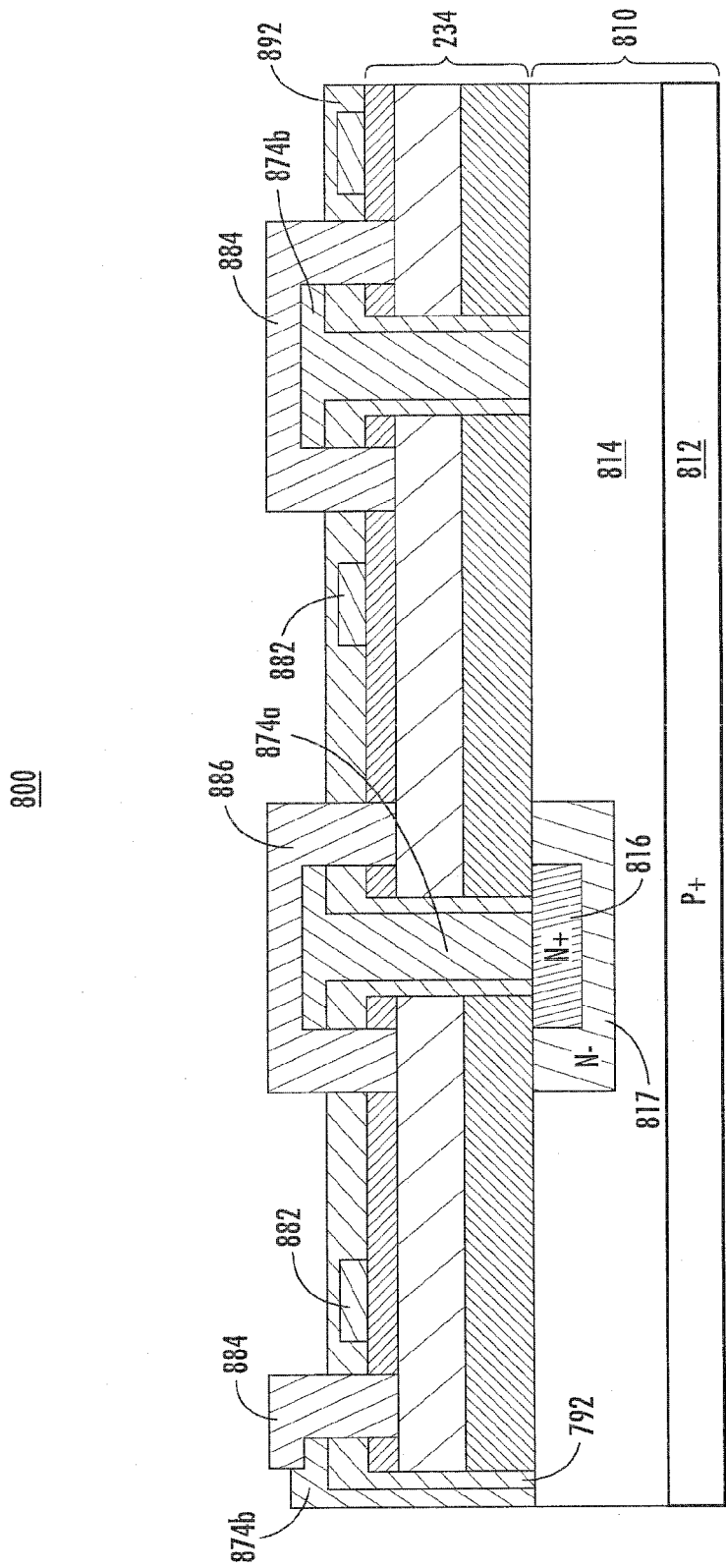
FIG. 8 depicts an exemplary power device integrated with an N+NPP+ diode in accordance with various embodiments of the present teachings.

In embodiments, various substrate and clamp structures can be used for the disclosed power devices. For example, FIG. 8, depicts an exemplary power device 800 having a substrate 810. The substrate 810 can be integrated with an N+NPP+ diode. In one embodiment, the exemplary device 800 can be formed by replacing the substrate 710 in FIG. 7 with the substrate 810 in FIG. 8.

As shown, the substrate 810 can include a P-epi layer 814 disposed on a P+ layer 812. In the P-epi layer 814, a cathode N+ region 816 can be formed in an N⁻ region 817, which is located in the P-epi layer 814. An N+/N⁻/P-epi/P+ diode can thus be integrated within the substrate 810.

The cathode N+ region 816 can be electrically connected with a drain electrode 886 through a first trench electrode 874a. The first trench electrode 874a can be formed through the layered active region 234 and on the N+ region 816 of the substrate 810. The device 800 can also include a second trench electrode 874b formed through the layered active region 234 and on the P-epi layer of the substrate 810. The second trench electrode 874b can be electrically connected with a source electrode 884 of the exemplary power device 800.

In this manner, the exemplary power device 800 can have an N+/N⁻/P-epi/P+ diode clamped drain, while the P+ layer 812 of the substrate 810 can be used as the device source connection.

Figure 9:
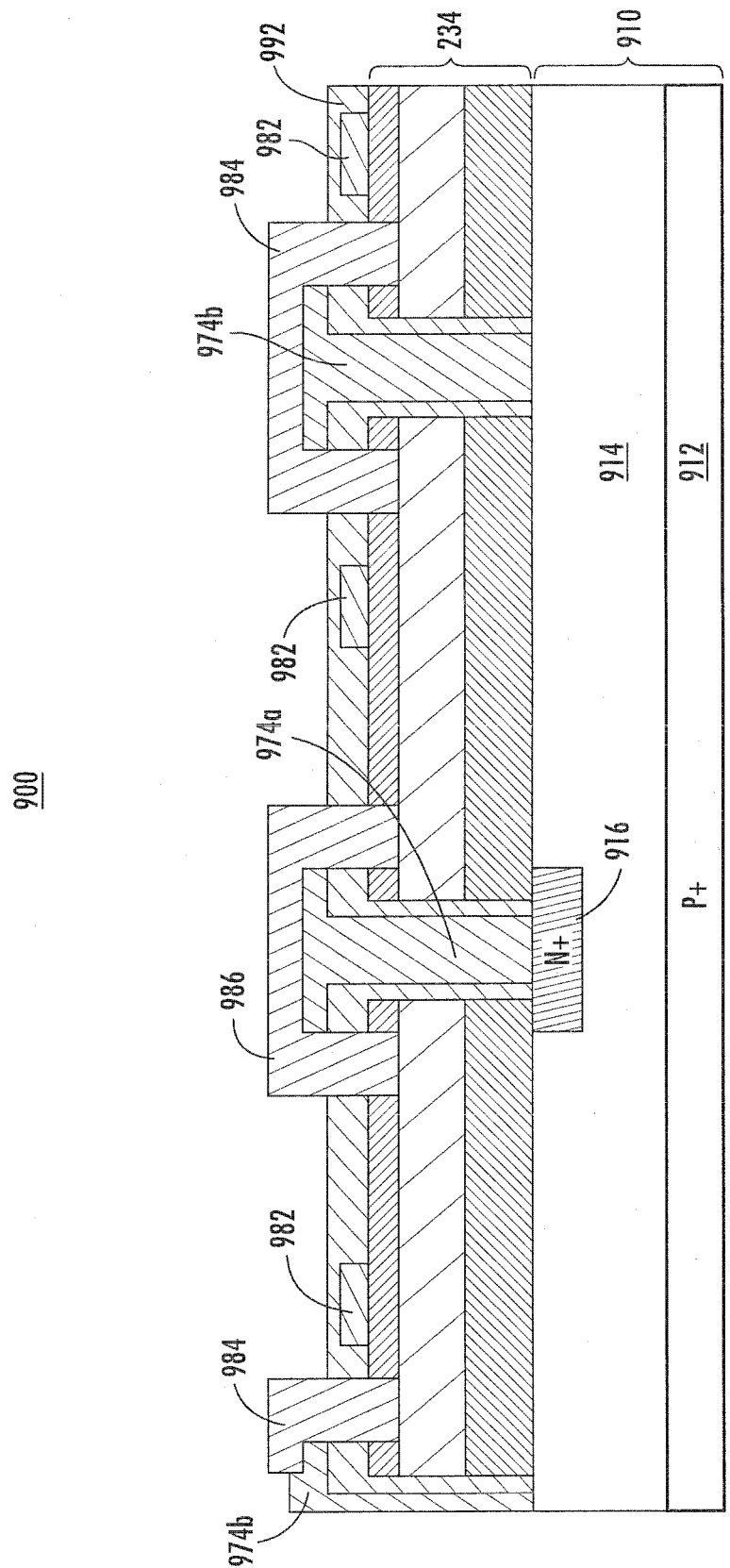
FIG. 9 depicts an exemplary power device integrated with an N+PP+ diode in accordance with various embodiments of the present teachings.

In embodiments, various other substrates can be used based on structure shown in FIGS. 6-8. For example, a substrate 910 can be used to replace the substrate 810 of FIG. 8 to form an exemplary power device 900 as shown in FIG. 9. Specifically, the substrate 910 can be integrated with an N+PP+ diode by forming an N+ region 916 directly in a P-epi layer 914 rather than in an N⁻ region (see 817) that is formed in the P-epi layer, as compared with the substrate 810 in FIG. 8.

The substrate 910 can also include a P+ layer 912, over which the P-epi layer 914 can be disposed. As similarly described in FIG. 8, the cathode N+ region 916 can be electrically connected with a drain electrode 986 through a first trench electrode 974a. The first trench electrode 974a can be formed through the layered active region 234 and on the N+ region 916 of the substrate 910. The device 900 can also include a second trench electrode 974b formed through the layered active region 234 and on the P-epi layer of the substrate 910. The second trench electrode 974b can be electrically connected with a source electrode 984 of the exemplary power device 900. In this manner, the exemplary power device 900 can have an N+PP+ diode clamped drain, while the P+ layer 912 of the substrate 810 can be used as the device source connection.

Figure 10:
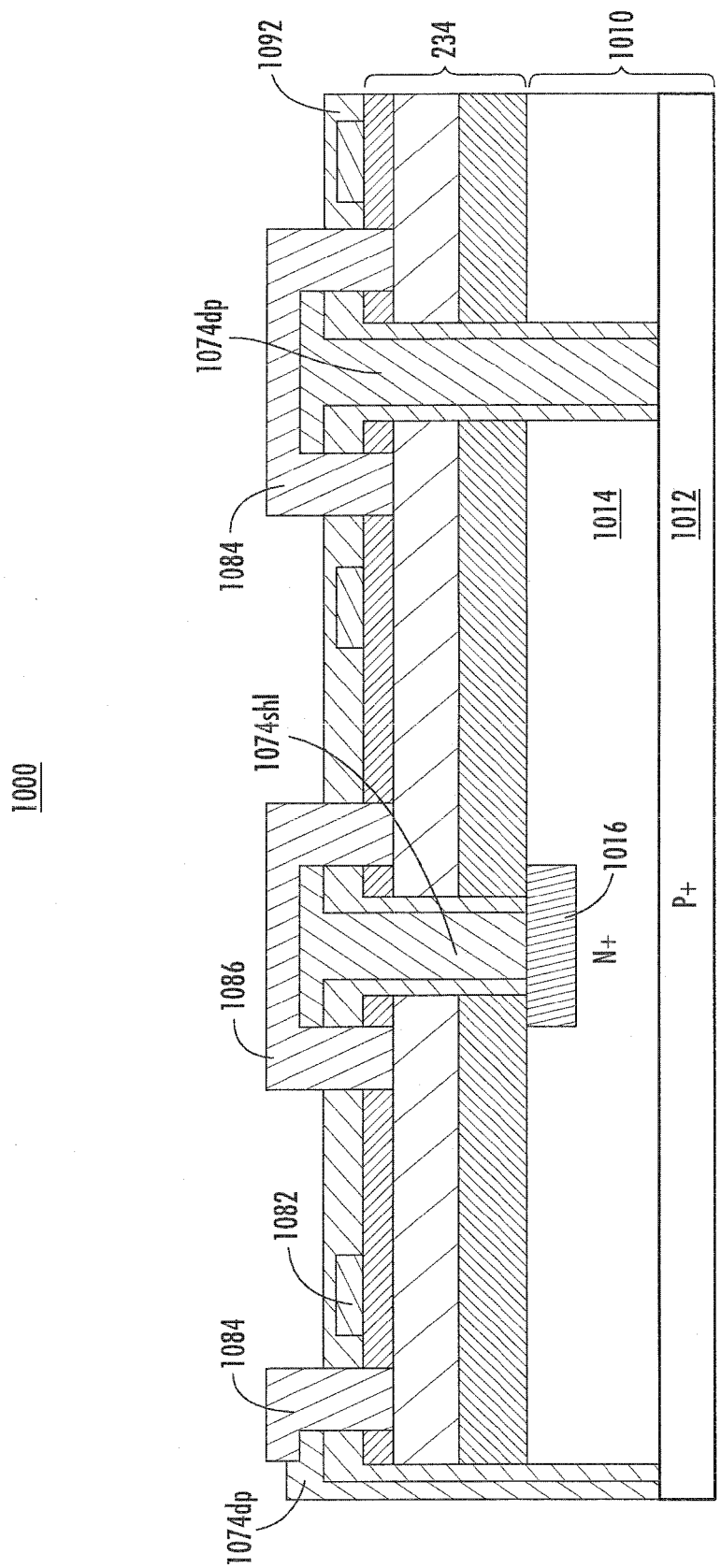
FIG. 10 depicts another exemplary power device integrated with an N+PP+ diode in accordance with various embodiments of the present teachings.
Figure 77A:
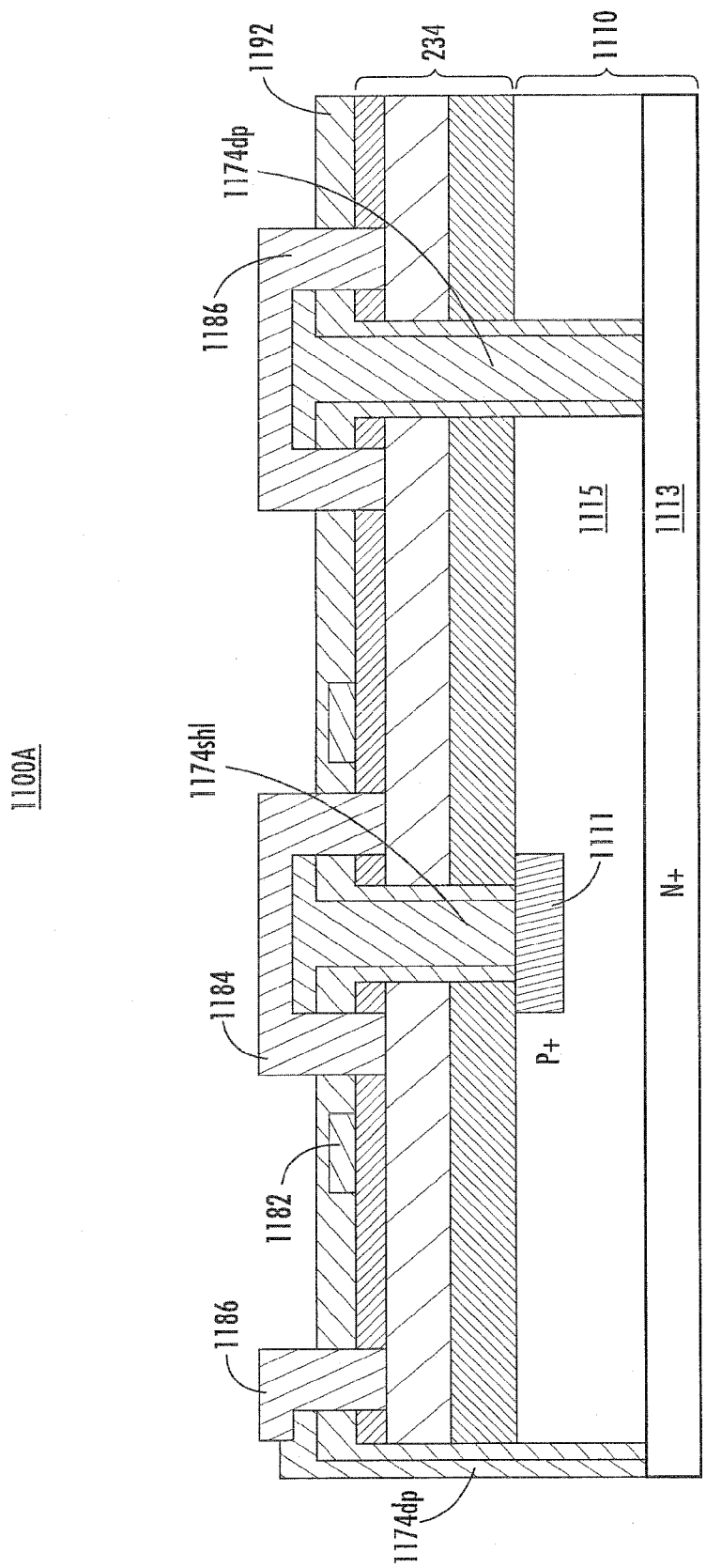

In embodiments, a deep trench electrode can be used to electrically connect the source electrode with the P+ layer of the substrate shown in FIG. 9 to form an exemplary device 1000 as shown in FIG. 10.

The device 1000 can include a substrate 1010 including a P+ layer 1012, over which a P-epi layer 1014 can be disposed. In the P-epi layer 1014, a cathode N+ region 1016 can be formed and can be electrically connected with a drain electrode 1086 through a shallow trench electrode 1074shl. The shallow trench electrode 1074shl can be formed through the layered active region 234 and on the N+ region 1016 of the substrate 1010. The device 1000 can also include a deep trench electrode 1074dp formed on the P+ layer of the substrate 1010 through the layered active region 234 and further through the P-epi layer 1014. The deep trench electrode 1074dp can electrically connect a source electrode 1084 of the exemplary power device with the P+ layer 1012 of the substrate 1010. In this manner, the exemplary power device 900 can have an N+PP+ diode clamped drain, while the P+ layer 1012 of the substrate 1010 can be used as the diode anode connection and active device source connection.

FIG. 11A depicts an exemplary power device 1100A integrated with a P+NN+ diode in accordance with various embodiments of the present teachings.

As shown, the device 1100A can include a substrate 1110 having an N-epi layer 1115 disposed on an N+ layer 1113. An anode P+ region 1111 can be formed in the N-epi layer 1115 to electrically connect with a shallow trench electrode 1174shl. The shallow trench electrode 1174shl can be formed through the layered active region 234 and on the P+ region 1111 of the substrate 1110 to electrically connect with a source electrode 1184 of the active device.

The device 1100A can also include a deep trench electrode 1174dp formed on the N+ layer 1113 of the substrate 1110 through the layered active region 234 and further through the N-epi layer 1115. The deep trench electrode 1174dp can electrically connect a drain electrode 1186 of the exemplary power device with the N+ layer 1113 of the substrate 1110. In this manner, the exemplary power device 1100A can have an P+NN+ diode clamped drain, while the N+ layer 1113 of the substrate 1110 can be used as the diode cathode connection and active device drain connection.

Based on the structure shown in FIG. 11A, FIG. 11B depicts an exemplary power device 1100B integrated with a Schottky diode in accordance with various embodiments of the present teachings.

As shown in FIG. 11B, a Schottky electrode (also see FIG. 4D and FIG. 5E) can be formed on the N-epi layer 1115 and in a shallow trench through the layered active region 234. For example, a Schottky electrode layer 1172 (also see 472 and 572 in FIGS. 4-5) can be formed inside the shallow trench and a shallow trench electrode 1174shl can be surrounded by the Schottky electrode layer 1172 in the shallow trench as described in FIGS. 4D and 5E to form a Schottky diode (not shown in FIG. 11B) with self-aligned P-guard rings. The shallow trench electrode 1174 in FIG. 11B can connect the source electrode 1184 of the active device to the N-epi layer 1115 of the substrate 1110. As similarly described in FIG. 11A, a deep trench electrode 1174dp can be deposited on the N+ region 1113 and can contact the drain electrode 1186 with the N+ layer 1113 of the substrate 1110. The deep trench electrode 1174dp can be used as a cathode connection and a drain connection.

Figure 12:
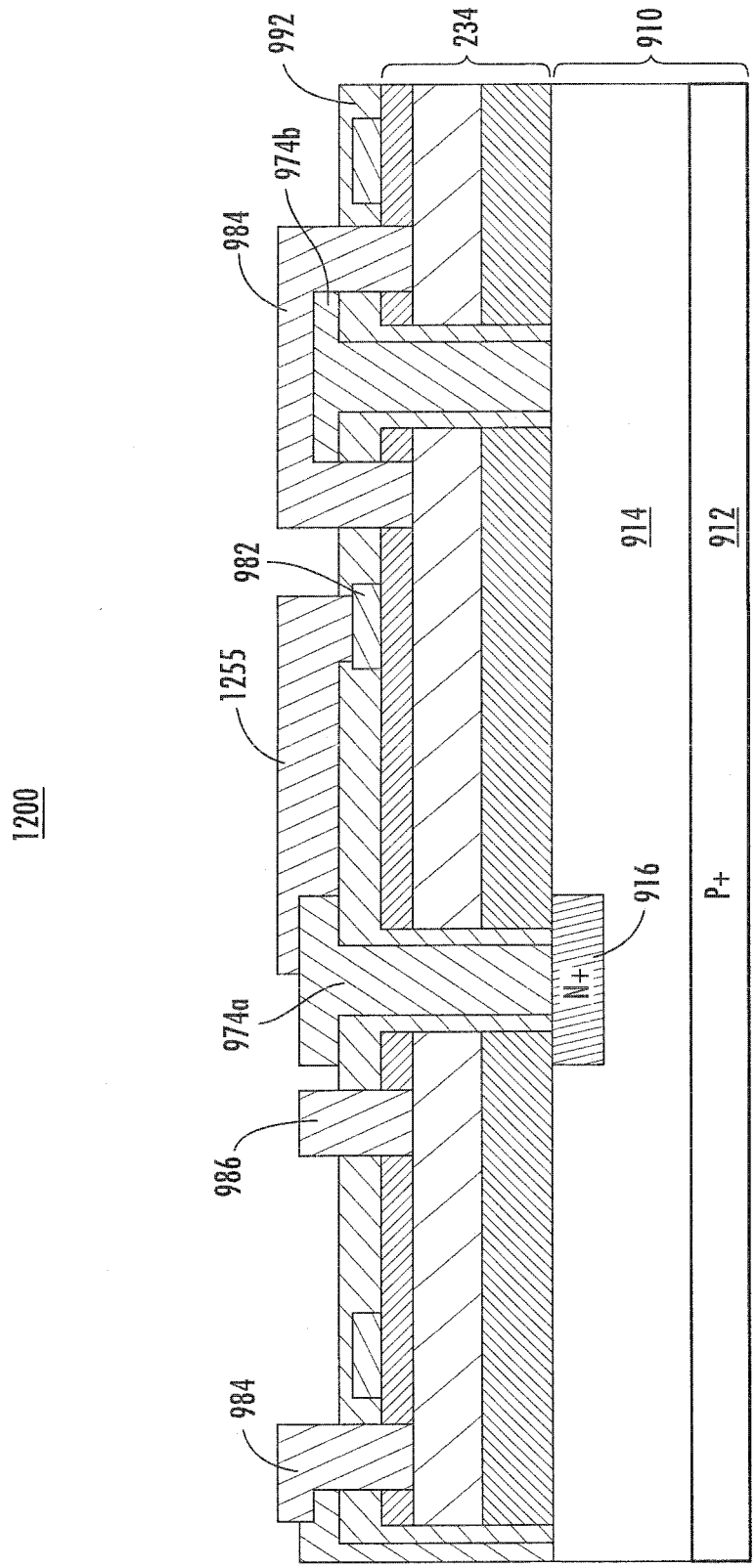
FIG. 12 depicts an exemplary power device integrated with an N+PP+ diode and a gate clamp in accordance with various embodiments of the present teachings.

In embodiments, the integrated clamp structure shown in FIGS. 1-11 can also be connected to the gate of the power device to provide gate to drain and/or gate to source protection. For example, FIG. 12 depicts an exemplary power device 1200 having a gate clamp structure integrated with the drain clamp of the device 900 of FIG. 9. As shown, the device 1200 can include a gate clamp structure 1255 electrically connecting a gate electrode 982 with a first trench electrode 974a, which is also electrically connected with the cathode N+ region 916. The cathode N+ region 916 can be formed in the P-epi layer 914. The power device 1200 can then have an N+PP+ diode clamped drain, while the P+ layer 912 of the substrate 910 can be used as device source connection. In embodiments, the first trench electrode 974a and the second trench electrode 974b can be isolated from surrounding semiconductor regions, i.e., the layered active region 234, by dielectric sidewalls 992 formed on the sidewalls of corresponding trenches through the layered active region 234.

In various embodiments, in addition to integrating clamp structures in power devices having silicon-based substrates as shown in FIGS. 1-12, a silicon-on-diamond substrate (SOD) or a silicon-on-diamond-on-silicon substrate (SODOS) can be used for power devices to incorporate clamp structures therewith.

Figure 13:
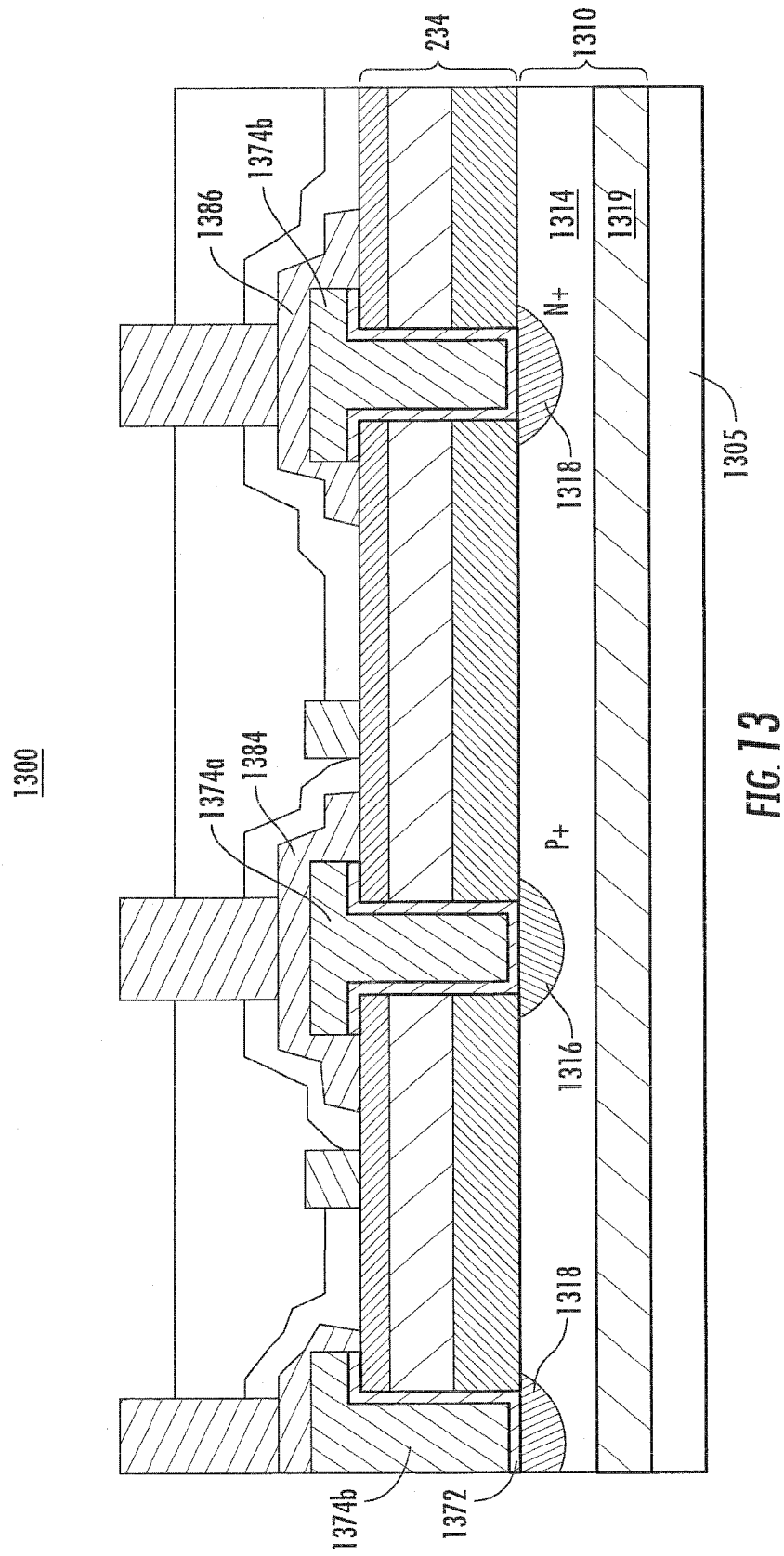
FIG. 13 depicts an exemplary power device having a silicon-on-diamond (SOD) substrate integrated with an N+PP+ diode in accordance with various embodiments of the present teachings.
Figure 16:
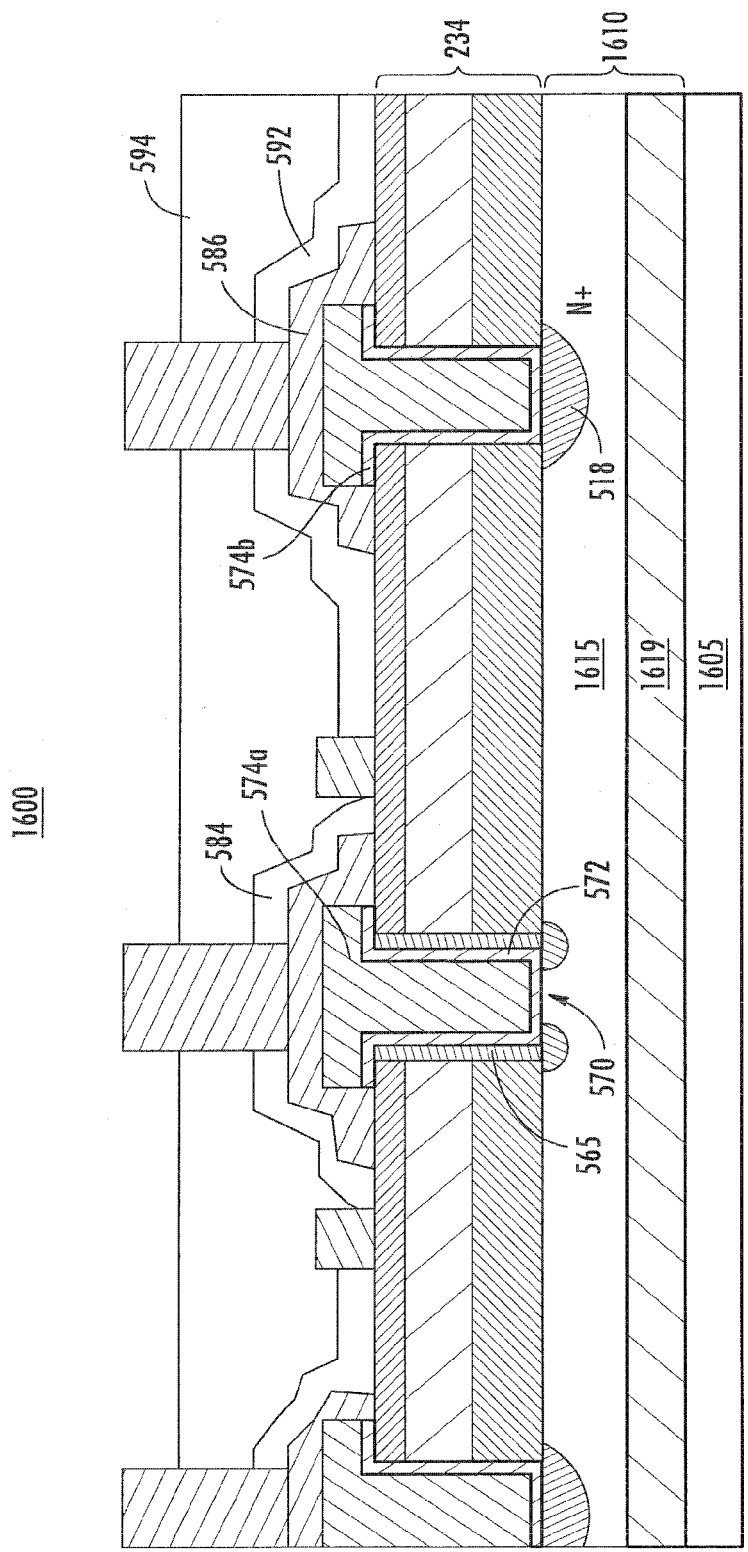
FIG. 16 depicts an exemplary power device having a SOD or silicon-on-diamond-on-silicon (SODOS) integrated with a Schottky diode in accordance with various embodiments of the present teachings.

In one embodiment, the diamond layer of a SOD or SODOS substrate can be P-doped or undoped. For example, the diamond layer can replace each P-doped layer of the substrates in FIGS. 1-12. FIGS. 13-14 and 16 depict various exemplary embodiments of power devices having a SOD or a SODOS. The SODOS substrate can have a silicon handle wafer attached on the backside of the diamond layer of a SOD substrate.

Specifically, the device 1300 of FIG. 13 can be formed by replacing the substrate 110 having P-epi layer 114 disposed on a P+ layer 112 shown in FIG. 1G with the SOD substrate 1310 of FIG. 13. The SOD 1310 can include a P-epi silicon layer 1314 on a P-doped diamond layer 1319. Optionally, a handle substrate 1305, for example, a P+ silicon substrate 1305 can be formed on an opposing surface of the P+ diamond layer 1319.

The device 1300 can also include a first trench electrode 1374a electrically connecting a source electrode 1384 with a P+ region 1316 in the P-epi layer 1314 and a second trench electrode 1374b electrically connecting a drain electrode 1386 with an N+ region 1318 in the P-epi layer 1314. Both the first and the second trench electrodes 1374a-b can be shallow trench electrodes having the same depth. In embodiments, a trench electrode layer 1372 and/or dielectric sidewalls (not shown in FIG. 13) can be formed along with the trench electrodes.

The exemplary power device 1300 can thus have a SOD substrate integrated with an N+PP+ diode. In embodiments, the ground connection of the power device can be performed at bottom of the device, e.g., on the handle wafer 1305.

In other embodiments, the diamond layer 1319 can be undoped for the device 1300. Because the diamond layer 1319 and/or the handle wafer 1305 are not doped, an insulated bottom connection can be alternatively performed for the device 1300.

Figure 14B:
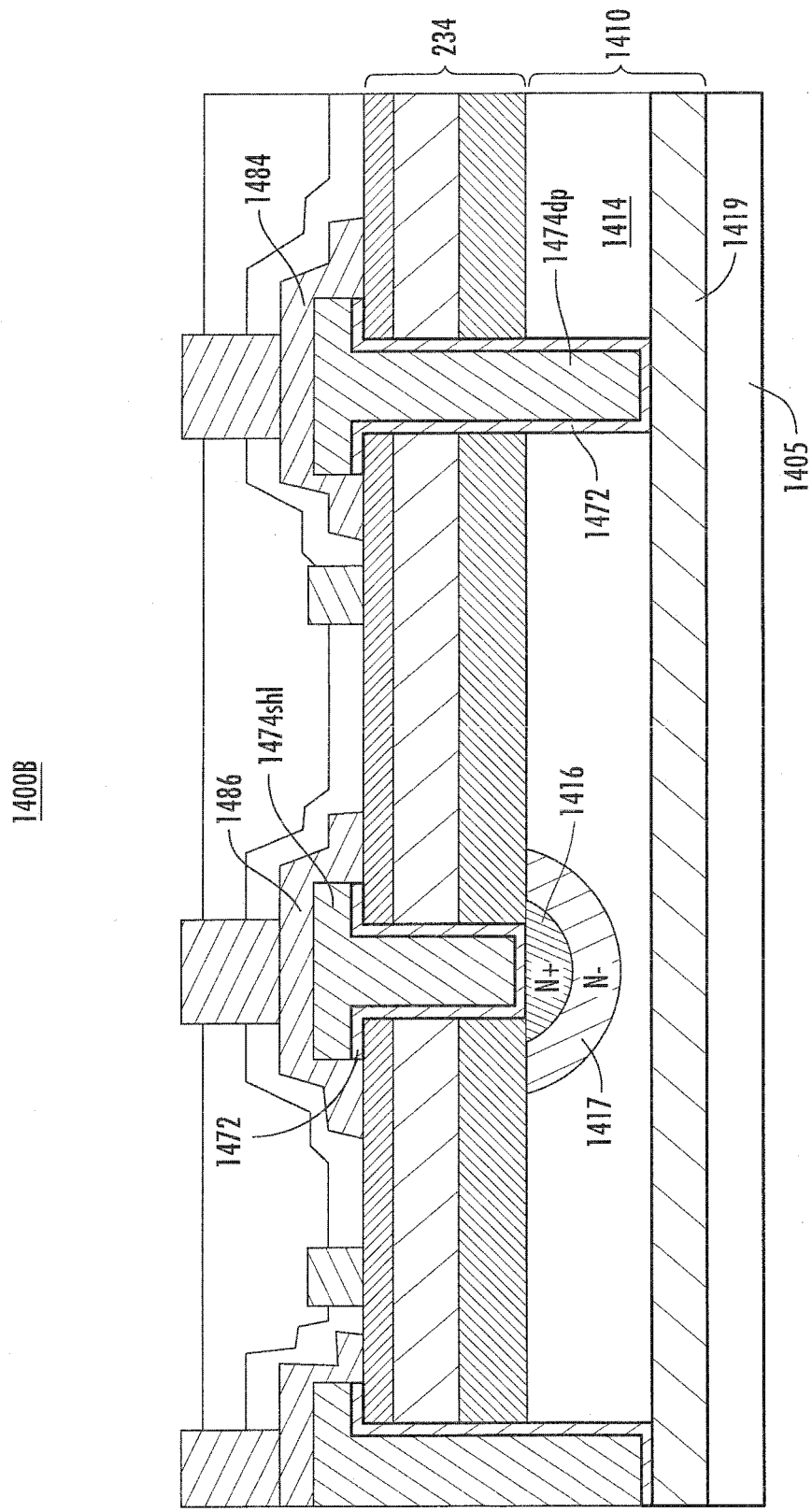

FIGS. 14A-14B depict exemplary power devices 1400A and 1400B having different depths of trench electrodes for cathode/anode trench fill as compared with the device 1300 in FIG. 13.

As shown in FIG. 14A, a shallow trench electrode 1474shl can be formed through layered active region 234 and on a P-epi layer 1414. The shallow trench electrode 1474shl can electrically connect a drain electrode 1486 with an N+ region 1416 formed in the P-epi layer 1414 of the substrate 1410. A deep trench electrode 1474dp can be formed on the P+ diamond layer 1419 through layered active region 234 and further through the P-epi layer 1414. The deep trench electrode 1474dp can electrically connect a source electrode 1484 with the P+ diamond layer 1419 of the substrate 1410. In embodiments, the deep source trench electrode can reduce source resistance and can simplify the assembly of the device.

Compared with the device 1400A, the device 1400B in FIG. 14B can further include an N⁻ diffusion region 1417 (by phosphorus diffusion for example) outside of the N+ contact diffusion region 1416 (by Arsenic for example) to adjust breakdown voltage of the device.

Figure 15A:
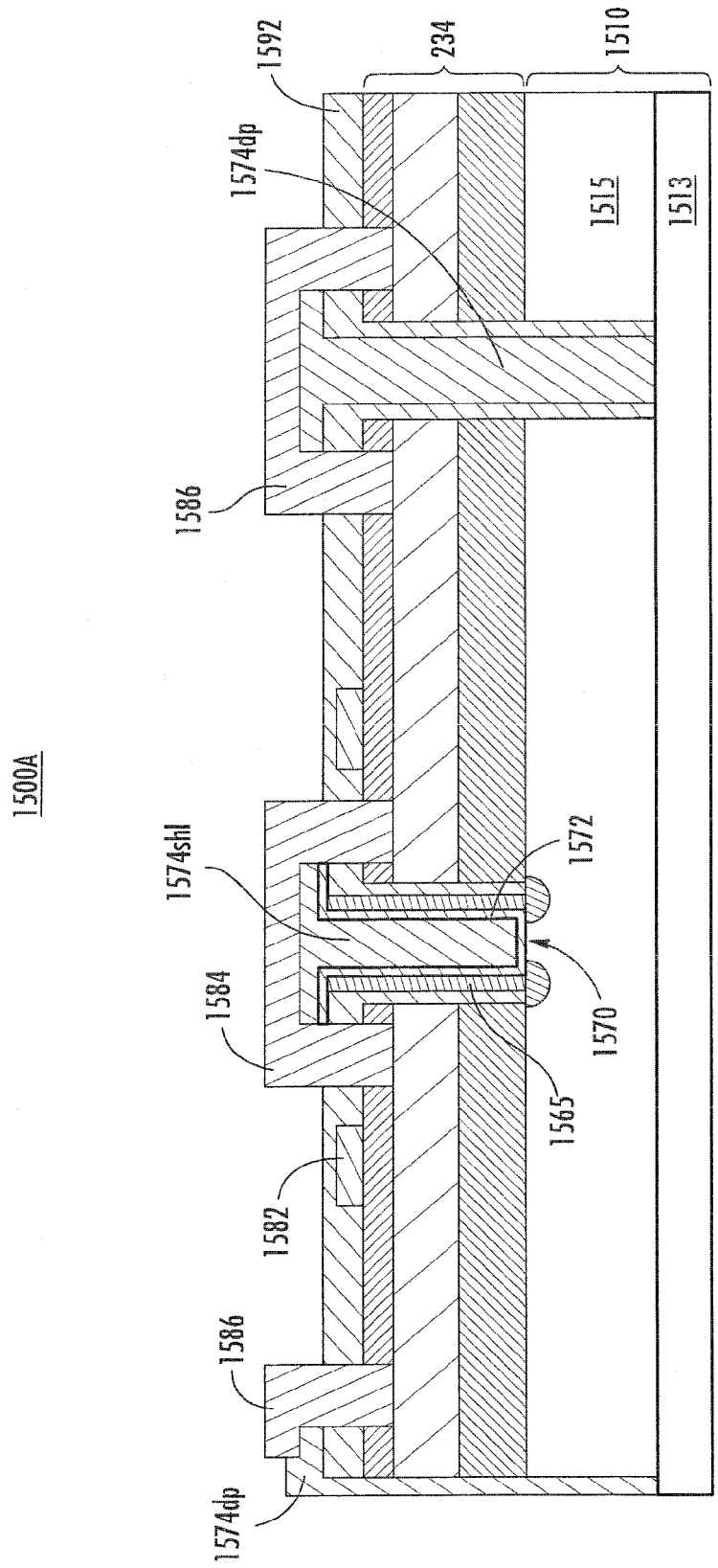
FIGS. 15A-15B depict exemplary power devices having a silicon-based substrate integrated with a Schottky diode in accordance with various embodiments of the present teachings.
Figure 15B:
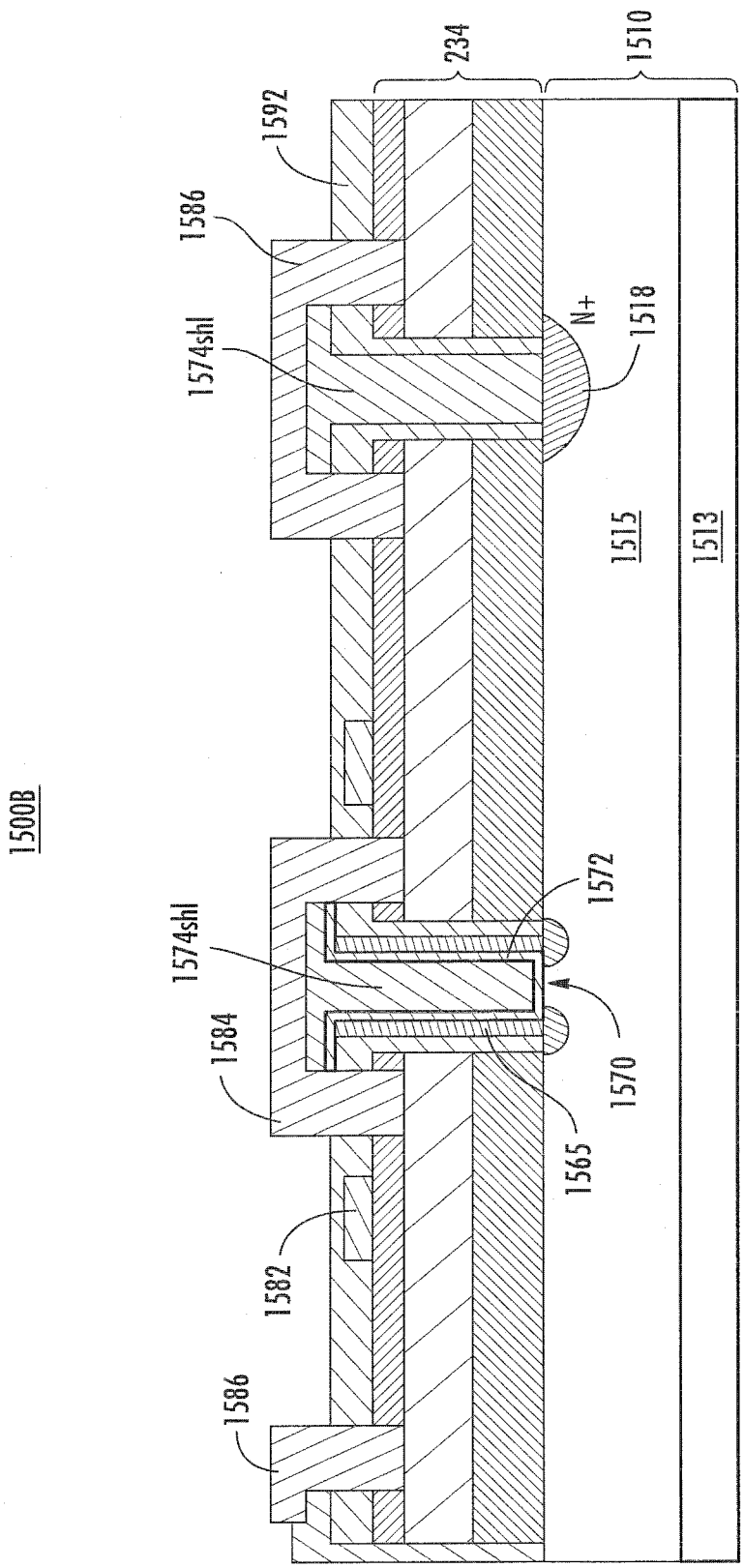

FIGS. 15A-15B depict exemplary power devices having a Schottky diode incorporated in a substrate with different or same depth of the trench electrodes in accordance with various embodiments of the present teachings.

The device 1500A can include a substrate 1510 having an N-epi layer 1515 disposed on an N+ layer 1513. A layered active region 234 can be formed over the substrate 1510.

A deep trench electrode 1574dp can contact a drain electrode 1584 and can be isolated from surrounding semiconductor regions by dielectric sidewalls 1592 of the corresponding deep trench formed on the N+ layer 1513 of the substrate 1510 through the layered active region 234 and further through the N-epi layer 1515 of the substrate 1510.

A shallow trench electrode 1574shl can be formed through the layered active region 234 and on the N-epi layer 1515 of the substrate 1510 contacting a source electrode 1586 with the N-epi layer 1515. A Schottky electrode layer 1572 can be formed inside the shallow trench surrounding the shallow trench electrode 1574shl and on the N-epi layer 1515. Exemplary P-type polysilicon sidewall spacers 1565 can be configured on the sidewalls of the Schottky electrode layer 1572 formed in the shallow trench. Schottky guard rings can then be formed from diffusion of P-type polysilicon sidewall spacers 1565.

Instead of having a deep trench for connecting the drain electrode 1584 with the N+ layer 1513 of the substrate 1510 as shown in FIG. 15A, the device 1500B in FIG. 15B can include a second shallow trench electrode 1574shl formed on the N-epi layer 1513. The second shallow trench electrode 1574shl can have the same depth as the first trench electrode 1574shl to electrically connect the drain electrode 1586 with an N+ region 1518 formed in the N-epi layer 1515.

FIG. 16 depicts an exemplary power device 1600 having a Schottky diode incorporated within a substrate of SOD or SODOS in accordance with various embodiments of the present teachings.

In this example, based on the device shown in FIG. 5F, the substrate 510 of FIG. 5F can be replaced by the substrate 1610 to form the exemplary device 1600 of FIG. 16. Specifically, the substrate 1610 can be a silicon-on-diamond substrate (SOD) having an N-epi silicon layer 1615 formed on an undoped diamond region 1619 or a SODOS substrate having an optional silicon handle wafer 1605 attached on the backside of the diamond layer 1619 opposing to the N-epi silicon layer 1615.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the present teachings disclosed herein. It is intended that the specification and examples be considered as exemplary only, with a true scope and spirit of the present teachings being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

What is claimed is:

1. A method of manufacturing an active device comprising:
   providing a substrate comprising an epitaxial layer disposed on an underlying layer;
   forming an active region of an active device over the substrate;
   forming a first trench and a second trench each through the active region and on the substrate;
   forming a first doped region in the epitaxial layer of the substrate, the first doped region coupled to the first trench;
   forming a second doped region in the epitaxial layer of the substrate, the second doped region coupled to the second trench;
   filling the first trench with a conductive material to form a first trench electrode;
   filling the second trench with a conductive material to form a second trench electrode;
   forming a source electrode of the active device electrically, the source electrode coupled to the first trench electrode; and
   forming a drain electrode of the active device electrically, the drain electrode coupled to the second trench electrode.

2. The method of claim 1, further comprising forming a dielectric layer or a trench electrode barrier layer on surfaces of the first trench or the second trench prior to filling with the conductive material.

3. The method of claim 1, further comprising
   forming a dielectric layer on sidewalls of each of the first trench and the second trench;
   forming a trench electrode barrier layer on each surface of the first trench having the dielectric layer and of the second trench having the dielectric layer; and
   filling the first trench having the trench electrode barrier layer with the conductive material to form the first trench electrode; and
   filling the second trench having the trench electrode barrier layer with the conductive material to form the second trench electrode.

4. The method of claim 1, wherein forming an active region of an active device over the substrate comprises forming a GaN-based active region.

5. The method of claim 1, wherein forming a first trench and a second trench comprises:
   forming the first trench through the active region and on the epitaxial layer; and
   forming the second trench through the active region and on the underlying layer.

6. A method of manufacturing a high electron mobility transistor (HEMT) comprising:
   providing a multi-layer substrate comprising a first layer disposed on a second layer;
   forming a HEMT active region over the substrate;
   forming a first trench through the HEMT active region to expose a portion of the first layer of the substrate;
   doping the exposed portion of the first layer to form a first doped region in the first layer of the substrate;
   forming a second trench through the HEMT active region to expose a second portion of one of the first layer or the second layer of the substrate;
   filling the first trench with a conductive material to form a first trench electrode;
   filling the second trench with a conductive material to form a second trench electrode;
   forming an HEMT source electrode electrically coupled to the first trench electrode; and
   forming an HEMT drain electrode electrically coupled to the second trench electrode.

7. The method of claim 6, further comprising forming a dielectric layer or a trench electrode barrier layer on surfaces of the first trench or the second trench prior to filling with the conductive material.

8. The method of claim 6, further comprising
   forming a dielectric layer on sidewalls of each of the first trench and the second trench;

forming a trench electrode barrier layer on each surface of the first trench having the dielectric layer and of the second trench having the dielectric layer; and filling the first trench having the trench electrode barrier layer with the conductive material to form the first trench electrode; and filling the second trench having the trench electrode barrier layer with the conductive material to form the second trench electrode.

9. The method of claim 6, wherein forming an HEMT active region comprises forming a GaN-based HEMT active region.

10. The method of claim 6, wherein the first trench is a shallow trench and the second trench is a deep trench.

* * * * *